United States Patent
Maruyama et al.

(10) Patent No.: US 12,216,405 B2
(45) Date of Patent: Feb. 4, 2025

(54) PHOTOSENSITIVE RESIN COMPOSITION, PHOTOSENSITIVE RESIN FILM, PHOTOSENSITIVE DRY FILM, PATTERNING PROCESS, AND LIGHT EMITTING DEVICE

(71) Applicant: SHIN-ETSU CHEMICAL CO., LTD., Tokyo (JP)

(72) Inventors: Hitoshi Maruyama, Annaka (JP); Tamotsu Oowada, Yokohama (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 253 days.

(21) Appl. No.: 17/778,203

(22) PCT Filed: Nov. 12, 2020

(86) PCT No.: PCT/JP2020/042168
§ 371 (c)(1),
(2) Date: May 19, 2022

(87) PCT Pub. No.: WO2021/111834
PCT Pub. Date: Jun. 10, 2021

(65) Prior Publication Data
US 2023/0030194 A1   Feb. 2, 2023

(30) Foreign Application Priority Data

Dec. 3, 2019 (JP) .................... 2019-219018

(51) Int. Cl.
| | | |
|---|---|---|
| G03F 7/075 | (2006.01) | |
| C08G 77/20 | (2006.01) | |
| G03F 7/004 | (2006.01) | |
| G03F 7/038 | (2006.01) | |
| G03F 7/105 | (2006.01) | |
| G03F 7/40 | (2006.01) | |

(52) U.S. Cl.
CPC ............ *G03F 7/0757* (2013.01); *C08G 77/20* (2013.01); *G03F 7/0047* (2013.01); *G03F 7/105* (2013.01); *G03F 7/40* (2013.01)

(58) Field of Classification Search
CPC ......... G03F 7/0757; G03F 7/0382; G03F 7/40
See application file for complete search history.

(56) References Cited

U.S. PATENT DOCUMENTS

| | | |
|---|---|---|
| 2013/0043433 A1 | 2/2013 | Liu et al. |
| 2013/0209921 A1* | 8/2013 | Qiu ............... G03F 7/0757 430/5 |
| 2016/0215212 A1* | 7/2016 | Lee ............... G02B 5/201 |
| 2018/0066159 A1 | 3/2018 | Karkkainen et al. |
| 2019/0064666 A1* | 2/2019 | Hayashi ............ C08G 77/52 |
| 2019/0177608 A1 | 6/2019 | Chisaka et al. |
| 2019/0196331 A1 | 6/2019 | Maruyama et al. |
| 2019/0352542 A1* | 11/2019 | Schwartz ........... C09J 7/10 |
| 2020/0157348 A1 | 5/2020 | Maruyama et al. |
| 2022/0010172 A1 | 1/2022 | Karkkainen et al. |

FOREIGN PATENT DOCUMENTS

| | | |
|---|---|---|
| EP | 3657253 B1 | 6/2021 |
| JP | 2016-053716 A | 4/2016 |
| JP | 2018-509510 A | 4/2018 |
| JP | 2019-105832 A | 6/2019 |
| TW | 201619694 A | 6/2016 |
| TW | 201700548 A | 1/2017 |
| TW | 201930453 A | 8/2019 |
| WO | 2016/146896 A1 | 9/2016 |

OTHER PUBLICATIONS

Sep. 13, 2022 Office Action issued in Japanese Patent Application No. 2019-219018.
Nov. 30, 2023 Extended European Search Report Issued in European Patent Application No. 20895064.2.
Jan. 19, 2021 International Search Report issued in International Patent Application No. PCT/JP2020/042168.
May 17, 2022 International Preliminary Report on Patentability issued in International Patent Application No. PCT/JP2020/042168.
Dec. 26, 2023 Taiwanese Office Action issued in Taiwanese Patent Application No. 109142322.
Nov. 26, 2024 Office Action issued in Korean Patent Application No. 2022-7018315.

\* cited by examiner

*Primary Examiner* — John S. Chu
(74) *Attorney, Agent, or Firm* — Oliff PLC

(57) ABSTRACT

A photosensitive resin composition containing (A) an acid-crosslinkable group-containing silicone resin, (B) a photo-acid generator, and (C) quantum dot particles. Thus, a photosensitive resin composition is capable of easily forming a film having favorable heat resistance, lithography resolution, and luminous properties; a photosensitive resin film and a photosensitive dry film are obtained by using the photosensitive resin composition; patterning processes use these; and a light emitting device is obtained by using the photosensitive resin composition.

19 Claims, No Drawings

PHOTOSENSITIVE RESIN COMPOSITION, PHOTOSENSITIVE RESIN FILM, PHOTOSENSITIVE DRY FILM, PATTERNING PROCESS, AND LIGHT EMITTING DEVICE

TECHNICAL FIELD

The present invention relates to: a photosensitive resin composition; and a photosensitive resin film, a photosensitive dry film, a patterning process, and a light emitting device which utilize the photosensitive resin composition.

BACKGROUND ART

Various methods have been proposed to form displays containing red, green, and blue subpixels. As one of the methods, there is a method in which light from an LED array is converted through a color conversion structure such that blue light having a shorter wavelength is converted to red and green light having longer wavelengths. Quantum dots have been employed for this color conversion.

Recently, such LED arrays are fabricated in micro size, and micro-LED displays using these have drawn attention. Although a method of forming a color conversion structure on an LED array includes a lithography process using a photosensitive material (see Patent Document 1), further improvements in miniaturization and heat resistance are demanded recently. In addition, there are high demands for luminous properties from the viewpoint of display clarity.

CITATION LIST

Patent Literature

Patent Document 1: JP 2016-53716 A

SUMMARY OF INVENTION

Technical Problem

The present invention has been made in view of the above circumstances. An object of the present invention is to provide: a photosensitive resin composition capable of easily forming a film having favorable heat resistance, lithography resolution, and luminous properties; a photosensitive resin film and a photosensitive dry film obtained by using the photosensitive resin composition; patterning processes using these; and a light emitting device obtained by using the photosensitive resin composition.

Solution to Problem

To achieve the object, the present invention provides a photosensitive resin composition comprising:
(A) an acid-crosslinkable group-containing silicone resin;
(B) a photo-acid generator; and
(C) quantum dot particles.

Such a photosensitive resin composition is capable of easily forming a film (photosensitive resin film) having favorable heat resistance (heat-resistance reliability), lithography resolution, and luminous properties.

In this case, the component (A) preferably comprises a silicone resin containing a repeating unit represented by any of the following formulae (A1) to (A6),

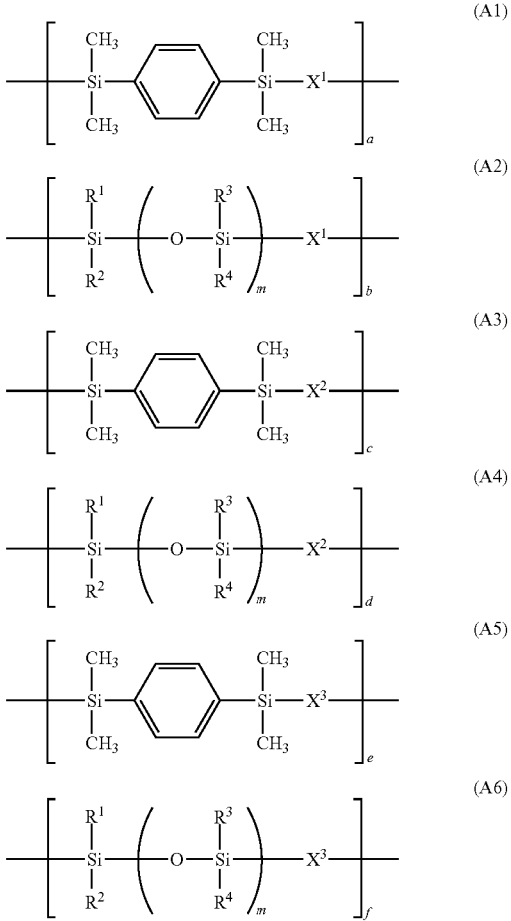

wherein $R^1$ to $R^4$ each independently represent a monovalent hydrocarbon group having 1 to 20 carbon atoms optionally containing a heteroatom; each "m" independently represents an integer of 1 to 600, and when "m" is an integer of 2 or more, $R^3$'s are identical to or different from one another, and $R^4$'s are identical to or different from one another; "a", "b" "c" "d" "e", and "f" represent numbers satisfying $0 \leq a \leq 1$, $0 \leq b \leq 1$, $0 \leq c \leq 1$, $0 \leq d \leq 1$, $0 \leq e \leq 1$, $0 \leq f \leq 1$, $0 < c+d+e+f \leq 1$, and $a+b+c+d+e+f=1$; each $X^1$ represents a divalent group shown by the following formula (X1); each $X^2$ represents a divalent group shown by the following formula (X2); and each $X^3$ represents a divalent group shown by the following formula (X3),

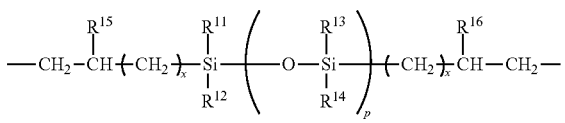

wherein $R^{11}$ to $R^{14}$ each independently represent a monovalent hydrocarbon group having 1 to 20 carbon atoms optionally containing a heteroatom; "p" represents an integer of 1 to 600, and when "p" is an integer of 2 or more, $R^{13}$'s are identical to or different from one another, and $R^{14}$'s are identical to or different from one another; $R^{15}$ and $R^{16}$ each independently represent a hydrogen atom or a methyl group; and each "x" independently represents an integer of 0 to 7,

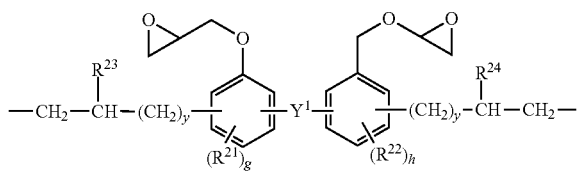

(X2)

wherein $Y^1$ represents a single bond, a methylene group, a propane-2,2-diyl group, a 1,1,1,3,3,3-hexafluoropropane-2,2-diyl group, or a fluorene-9,9-diyl group; $R^{21}$ and $R^{22}$ each independently represent an alkyl or alkoxy group having 1 to 4 carbon atoms; "g" and "h" each independently represent 0, 1, or 2, when "g" is 2, $R^{21}$'s are identical to or different from one another, and when "h" is 2, $R^{22}$'s are identical to or different from one another; $R^{23}$ and $R^{24}$ each independently represent a hydrogen atom or a methyl group; and each "y" independently represents an integer of 0 to 7, and

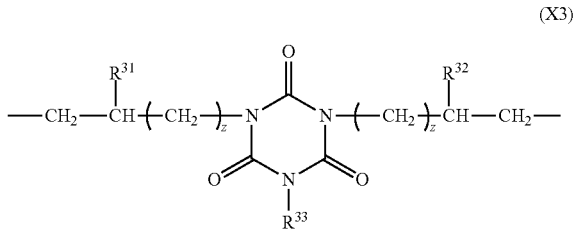

(X3)

wherein $R^{31}$ and $R^{32}$ each independently represent a hydrogen atom or a methyl group; each "z" independently represents an integer of 0 to 7; and $R^{33}$ represents a monovalent hydrocarbon group having 1 to 8 carbon atoms optionally containing an ester bond or an ether bond, or a monovalent group shown by the following formula (X3-1),

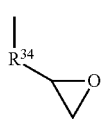

(X3-1)

wherein $R^{34}$ represents a divalent hydrocarbon group having 1 to 8 carbon atoms optionally containing an ester bond or an ether bond.

Such a photosensitive resin composition can easily form a film (photosensitive resin film) having more favorable heat resistance (heat-resistance reliability), lithography resolution, and luminous properties.

Moreover, the quantum dot particles (C) may comprise red quantum dot particles or green quantum dot particles, and may be composed of a II-VI semiconductor compound; a III-V semiconductor compound; a IV-VI semiconductor compound; a group IV element or a compound containing a group IV element; or a combination thereof.

Such quantum dot particles can be suitably employed in the inventive photosensitive resin composition.

Further, the inventive photosensitive resin composition preferably comprises the quantum dot particles (C) in an amount of 3 to 80 mass % based on a total solid content of the photosensitive resin composition.

When the content percentage of the quantum dots is within this range, fine pattern formation is possible while favorable emission intensity is retained.

Additionally, the inventive photosensitive resin composition can further comprise (D) a crosslinking agent.

Incorporating a crosslinking agent causes a reaction with, for example, an epoxy group of the component (A), facilitates pattern formation, and can further enhance the strength of the resin film after photo-curing.

Moreover, the inventive photosensitive resin composition can further comprise (E) an antioxidant.

Incorporating an antioxidant can enhance the heat resistance.

In addition, the inventive photosensitive resin composition can further comprise (F) a solvent.

Incorporating a solvent into the inventive photosensitive resin composition can enhance the coating property.

The present invention also provides a photosensitive resin film comprising a dried product of the above-described photosensitive resin composition, and further provides a photosensitive dry film comprising: a support film; and the photosensitive resin film on the support film.

The inventive photosensitive resin film can be easily formed using the above-described photosensitive resin composition. The photosensitive dry film can be produced by: applying the photosensitive resin composition onto a base material, and drying the composition to form the photosensitive resin film. Particularly, since the photosensitive dry film is solid and the photosensitive resin film does not contain a solvent, these eliminate a risk that air bubbles caused by solvent volatilization remain in the photosensitive resin film or between the photosensitive resin film and uneven substrate.

Moreover, the present invention provides a patterning process comprising steps of:
 (i) applying the above-described photosensitive resin composition onto a substrate to form a photosensitive resin film on the substrate;
 (ii) exposing the photosensitive resin film to light; and
 (iii) developing the exposed photosensitive resin film with a developer to dissolve and remove an unexposed portion for patterning.

Further, the present invention provides a patterning process comprising steps of:
 (i') forming a photosensitive resin film on a substrate by using the above-described photosensitive dry film;
 (ii) exposing the photosensitive resin film to light; and
 (iii) developing the exposed photosensitive resin film with a developer to dissolve and remove an unexposed portion for patterning.

The patterning processes employing the inventive photosensitive resin composition or photosensitive dry film make it possible to easily form a fine pattern with large thickness.

In this case, the patterning processes can further comprise (iv) a step of post-curing the resin film patterned by the development, the post-curing being performed at a temperature of 100 to 250° C.

Including such a post-curing step is preferable from the viewpoints of adhesive force to a substrate, heat resistance, strength, electrical properties, and bond strength because the post-curing can increase the crosslinking density of the photosensitive resin composition and remove the remaining volatile component.

Furthermore, the present invention provides a light emitting device comprising the above-described photosensitive resin film.

The inventive photosensitive resin film has favorable dry film formability, resolution, luminous properties, and heat resistance (adhesiveness, crack resistance, and emission intensity retention) and is suitable in light emitting device.

Advantageous Effects of Invention

Since the inventive photosensitive resin composition contains an acid-crosslinkable group-containing silicone resin, a photo-acid generator, and quantum dot particles, these facilitate film formation. The film has favorable dry film formability, resolution, luminous properties, and heat resistance (adhesiveness, crack resistance, and emission intensity retention), and is suitable in light emitting device.

DESCRIPTION OF EMBODIMENTS

As noted above, there have been demands for further miniaturization in lithography processes using photosensitive materials and also high demands for heat resistance and luminous properties. Thus, it has been desired to develop a photosensitive material that satisfies these demands.

The present inventors have earnestly studied to achieve the object and consequently found that a photosensitive resin composition containing an acid-crosslinkable group-containing silicone resin, a photo-acid generator, and quantum dots can easily form a film, and that the film has favorable dry film formability, resolution, luminous properties, and heat resistance (adhesiveness, crack resistance, and emission intensity retention) and can provide a cured film suitable for a light emitting device. These findings have led to the completion of the present invention.

Specifically, the present invention is a photosensitive resin composition comprising:

(A) an acid-crosslinkable group-containing silicone resin;

(B) a photo-acid generator; and (C) quantum dot particles.

Hereinafter, the present invention will be described in detail, but the present invention is not limited thereto.

[Photosensitive Resin Composition]

A photosensitive resin composition of the present invention contains (A) an acid-crosslinkable group-containing silicone resin, (B) a photo-acid generator, and (C) quantum dot particles. As necessary, the inventive photosensitive resin composition may further contain other components, such as (D) a crosslinking agent, (E) an antioxidant, and (F) a solvent. Hereinbelow, each component constituting the photosensitive resin composition will be described.

[(A) Acid-Crosslinkable Group-Containing Silicone Resin]

The component (A) is an acid-crosslinkable group-containing silicone resin that is a resin having a siloxane structure and an acid-crosslinkable group. Herein, acid-crosslinkable group means a group capable of forming a chemical bond by action of an acid. The siloxane structure and the acid-crosslinkable group are not particularly limited. In the present invention, the acid-crosslinkable group is preferably an epoxy group, an oxetane group, a vinyl ether group, or the like, particularly preferably an epoxy group.

The acid-crosslinkable group-containing silicone resin as the component (A) is a silicone resin containing preferably a repeating unit represented by any of the following formulae (A1) to (A6) (hereinafter, also referred to as repeating units A1 to A6, respectively), more preferably containing an epoxy group.

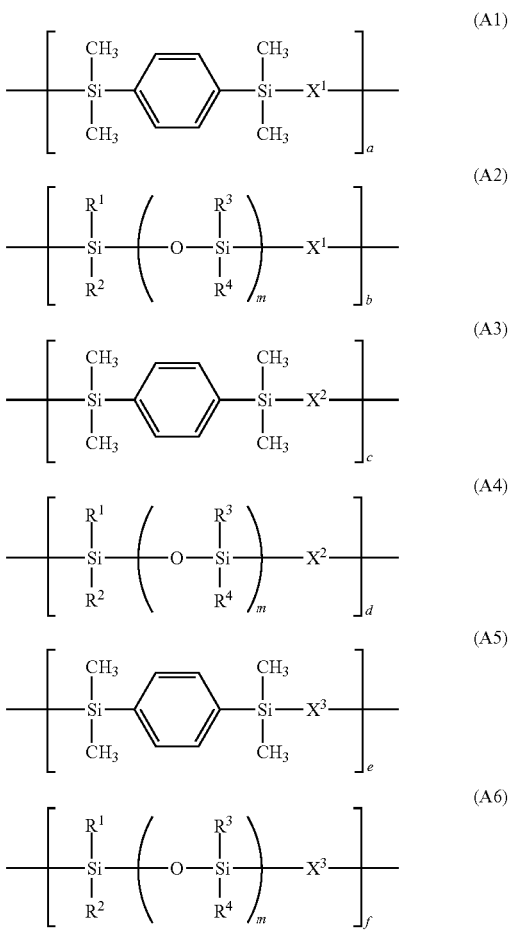

In the formulae (A2), (A4), and (A6), $R^1$ to $R^4$ each independently represent a monovalent hydrocarbon group having 1 to 20 carbon atoms optionally containing a heteroatom. Each "m" independently represents an integer of 1 to 600. When "m" is an integer of 2 or more, $R^3$'s are identical to or different from one another, and $R^4$'s are identical to or different from one another. In the repeating units A2, A4 and A6, when the number of siloxane units is 2 or more, all the siloxane units may be identical, or two or more kinds of different siloxane units may be incorporated. When two or more kinds of different siloxane units are incorporated (i.e., when "m" is an integer of 2 or more), the siloxane units may be bonded randomly or alternately, or multiple blocks each consisting of the same kind of siloxane units may be incorporated.

The monovalent hydrocarbon group may be linear, branched, or cyclic. Specific examples thereof include monovalent aliphatic hydrocarbon groups, such as alkyl groups having 1 to 20 carbon atoms and alkenyl groups having 2 to 20 carbon atoms; and monovalent aromatic hydrocarbon groups, such as aryl groups having 6 to 20 carbon atoms and aralkyl group having 7 to 20 carbon atoms.

Examples of the alkyl groups include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, a cyclopentyl group, an n-hexyl group, a cyclohexyl group, an n-heptyl group, an n-octyl group, an n-nonyl group, an n-decyl group, a norbornyl group, an adamantyl group, etc. Examples of the alkenyl groups include a vinyl group, a propenyl group, a butenyl group, a hexenyl group, etc.

Moreover, the monovalent aliphatic hydrocarbon groups may contain a heteroatom. Specifically, the monovalent aliphatic hydrocarbon groups may have some or all of hydrogen atoms substituted with, for example, a halogen atom, such as a fluorine atom, a chlorine atom, a bromine atom, and an iodine atom. The monovalent aliphatic hydrocarbon groups may have carbon atoms intervened by a carbonyl group, an ether bond, a thioether bond, or the like. Examples of the monovalent aliphatic hydrocarbon groups containing such a heteroatom include a 2-oxocyclohexyl group, etc.

Examples of the aryl groups include a phenyl group, a 2-methylphenyl group, a 3-methylphenyl group, a 4-methylphenyl group, a 2-ethylphenyl group, a 3-ethylphenyl group, a 4-ethylphenyl group, a 4-tert-butylphenyl group, a 4-butylphenyl group, a dimethylphenyl group, a naphthyl group, a biphenylyl group, a terphenylyl group, etc. Examples of the aralkyl groups include a benzyl group, a phenethyl group, etc.

Further, the monovalent aromatic hydrocarbon groups may contain a heteroatom. Specifically, the monovalent aromatic hydrocarbon groups may have some or all of hydrogen atoms substituted with an alkoxy group having 1 to 10 carbon atoms, an alkylthio group having 1 to 10 carbon atoms, an aryloxy group having 6 to 20 carbon atoms, an arylthio group having 6 to 20 carbon atoms, or the like.

Examples of the alkoxy group having 1 to 10 carbon atoms include a methoxy group, an ethoxy group, an n-propyloxy group, an isopropyloxy group, a cyclopropyloxy group, an n-butyloxy group, an isobutyloxy group, a sec-butyloxy group, a tert-butyloxy group, a cyclobutyloxy group, an n-pentyloxy group, a cyclopentyloxy group, an n-hexyloxy group, a cyclohexyloxy group, an n-heptyloxy group, an n-octyloxy group, an n-nonyloxy group, an n-decyloxy group, a norbornyloxy group, an adamantyloxy group, etc.

Examples of the alkylthio group having 1 to 10 carbon atoms include a methylthio group, an ethylthio group, an n-propylthio group, an isopropylthio group, a cyclopropylthio group, an n-butylthio group, an isobutylthio group, a sec-butylthio group, a tert-butylthio group, a cyclobutylthio group, an n-pentylthio group, a cyclopentylthio group, an n-hexylthio group, a cyclohexylthio group, an n-heptylthio group, an n-octylthio group, an n-nonylthio group, an n-decylthio group, a norbornylthio group, an adamantylthio group, etc.

Examples of the aryloxy group having 6 to 20 carbon atoms include a phenyloxy group, a 2-methylphenyloxy group, a 3-methylphenyloxy group, a 4-methylphenyloxy group, a 2-ethylphenyloxy group, a 3-ethylphenyloxy group, a 4-ethylphenyloxy group, a 4-tert-butylphenyloxy group, a 4-butylphenyloxy group, a dimethylphenyloxy group, a naphthyloxy group, a biphenylyloxy group, a terphenyloxy group, etc.

Examples of the arylthio group having 6 to 20 carbon atoms include a phenylthio group, a 2-methylphenylthio group, a 3-methylphenylthio group, a 4-methylphenylthio group, a 2-ethylphenylthio group, a 3-ethylphenylthio group, a 4-ethylphenylthio group, a 4-tert-butylphenylthio group, a 4-butylphenylthio group, a dimethylphenylthio group, a naphthylthio group, a biphenylylthio group, a terphenylylthio group, etc.

Examples of the aryl groups substituted with these groups include a 2-methoxyphenyl group, a 3-methoxyphenyl group, a 4-methoxyphenyl group, a 2-ethoxyphenyl group, a 3-ethoxyphenyl group, a 4-ethoxyphenyl group, a 3-tert-butoxyphenyl group, a 4-tert-butoxyphenyl group, a biphenylyloxyphenyl group, a biphenylylthiophenyl group, etc.

The number of carbon atoms in the monovalent aliphatic hydrocarbon groups is preferably 1 to 10, more preferably 1 to 8. Moreover, the number of carbon atoms in the monovalent aromatic hydrocarbon groups is preferably 6 to 14, more preferably 6 to 10.

Among these, $R^1$ to $R^4$ are preferably a methyl group, an ethyl group, an n-propyl group, or a phenyl group, more preferably a methyl group or a phenyl group.

In the formulae (A2), (A4), and (A6), each "m" is independently an integer of 1 to 600, preferably 1 to 300, more preferably 1 to 100.

In the formulae (A1) to (A6), "a", "b", "c", "d", "e", and "f" represent numbers satisfying $0 \leq a \leq 1$, $0 \leq b \leq 1$, $0 \leq c \leq 1$, $0 \leq d \leq 1$, $0 \leq e \leq 1$, $0 \leq f \leq 1$, $0 < c+d+e+f \leq 1$, and $a+b+c+d+e+f=1$. Preferably, the numbers satisfy $0.2 \leq a+c+e \leq 0.95$, $0.05 \leq b+d+f \leq 0.8$, $0 \leq a+b \leq 0.9$, $0 \leq c+d \leq 0.7$, and $0 < e+f \leq 1$. Further preferably, the numbers satisfy $0.3 \leq a+c+e \leq 0.9$, $0.1 \leq b+d+f \leq 0.7$, $0 \leq a+b \leq 0.6$, $0 \leq c+d \leq 0.4$, and $0.4 \leq e+f \leq 1$.

In the formulae (A1) and (A2), $X^1$ represents a divalent group shown by the following formula (X1).

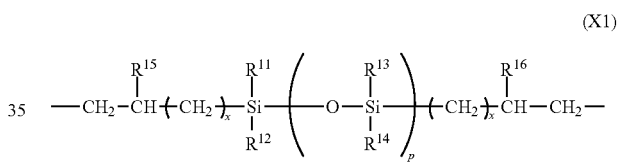

(X1)

In the formula (X1), $R^{11}$ to $R^{14}$ each independently represent a monovalent hydrocarbon group having 1 to 20 carbon atoms optionally containing a heteroatom. "p" represents an integer of 1 to 600. When "p" is an integer of 2 or more, $R^{13}$'s are identical to or different from one another, and $R^{14}$'s are identical to or different from one another. $R^{15}$ and $R^{16}$ each independently represent a hydrogen atom or a methyl group. Each "x" independently represents an integer of 0 to 7. In the group shown by the formula (X1), when the number of siloxane units is 2 or more, all the siloxane units may be identical, or two or more kinds of different siloxane units may be incorporated. When two or more kinds of different siloxane units are incorporated (i.e., when "p" is an integer of 2 or more), the siloxane units may be bonded randomly or alternately, or multiple blocks each consisting of the same kind of siloxane units may be incorporated.

The monovalent hydrocarbon group optionally containing a heteroatom may be linear, branched, or cyclic. Specific examples thereof include those described above in the description of $R^1$ to $R^4$. Among these, $R^{11}$ to $R^{14}$ are preferably a methyl group, an ethyl group, an n-propyl group, a phenyl group, or the like, more preferably a methyl group or a phenyl group.

In the formulae (A3) and (A4), $X^2$ represents a divalent group shown by the following formula (X2).

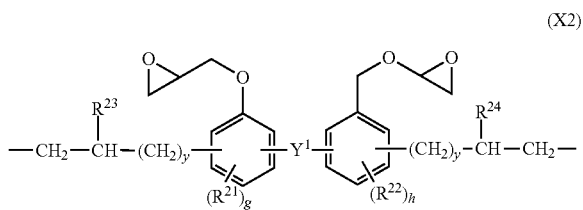
(X2)

In the formula (X2), $Y^1$ represents a single bond, a methylene group, a propane-2,2-diyl group, a 1,1,1,3,3,3-hexafluoropropane-2,2-diyl group, or a fluorene-9,9-diyl group. $R^{21}$ and $R^{22}$ each independently represent an alkyl or alkoxy group having 1 to 4 carbon atoms. "g" and "h" each independently represent 0, 1, or 2. When "g" is 2, $R^{21}$'s are identical to or different from one another. When "h" is 2, $R^{22}$'s are identical to or different from one another. $R^{23}$ and $R^{24}$ each independently represent a hydrogen atom or a methyl group. Each "y" independently represents an integer of 0 to 7.

In the formulae (A5) and (A6), $X^3$ represents a divalent group shown by the following formula (X3).

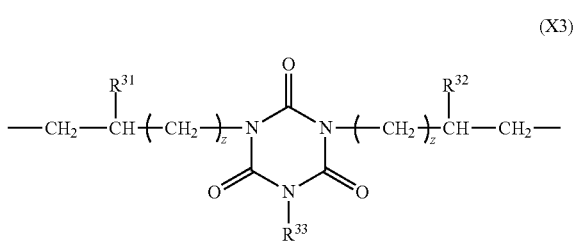
(X3)

In the formula (X3), $R^{31}$ and $R^{32}$ each independently represent a hydrogen atom or a methyl group. Each "z" independently represents an integer of 0 to 7.

In the formula (X3), $R^{33}$ represents a monovalent hydrocarbon group having 1 to 8 carbon atoms optionally containing an ester bond or an ether bond, or a monovalent group shown by the following formula (X3-1). $R^{33}$ is preferably a glycidyl group of the formula (X3-1).

(X3-1)

In the formula, $R^{34}$ represents a divalent hydrocarbon group having 1 to 8 carbon atoms optionally containing an ester bond or an ether bond.

The monovalent hydrocarbon group may be linear, branched, or cyclic. Specific examples thereof include alkyl groups, such as a methyl group, an ethyl group, and an n-propyl group; aryl groups, such as a phenyl group; etc. Among these, a methyl group or a phenyl group is preferable, and a methyl group is more preferable. Moreover, the monovalent hydrocarbon group may have carbon atoms intervened by an ester bond or an ether bond.

In the formula (X3-1), $R^{34}$ is a divalent hydrocarbon group having 1 to 8 carbon atoms optionally containing an ester bond or an ether bond. The divalent hydrocarbon group may be linear, branched, or cyclic. Specific examples thereof include alkanediyl groups, such as a methylene group, an ethylene group, a propane-1,2-diyl group, a propane-1,3-diyl group, a butane-1,2-diyl group, a butane-1,3-diyl group, a butane-1,4-diyl group, etc. Among these, a methylene group or an ethylene group is preferable, and a methylene group is more preferable. Moreover, the divalent hydrocarbon group may have carbon atoms intervened by an ester bond or an ether bond.

$R^{33}$ is preferably a methyl group, a phenyl group, or a glycidyl group, more preferably a methyl group or a glycidyl group.

The repeating units A1 to A6 may be bonded randomly or bonded as a block polymer.

Further, the acid-crosslinkable group-containing silicone resin preferably has a silicone (siloxane unit) content of 30 to 80 mass %.

The acid-crosslinkable group-containing silicone resin has a weight-average molecular weight (Mw) of preferably 3,000 to 500,000, more preferably 5,000 to 200,000. Note that, in the present invention, Mw is a value measured in terms of polystyrene by gel permeation chromatography (GPC) using tetrahydrofuran as an elution solvent.

The component (A) can be prepared, for example, by mixing required amounts of a vinyl group-containing compound and a hydrosilyl group-containing organosilicon compound corresponding to moieties in the component (A), and subjecting the mixture to hydrosilylation reaction according to conventional methods.

One kind of the acid-crosslinkable group-containing silicone resin as the component (A) may be used singly, or two or more kinds thereof may be used in combination. Note that the content percentage of silicone (which can be determined by $^{29}$Si-NMR measurement) contained in the component (A) to be used is preferably 30 to 80 mass %.

[(B) Photo-Acid Generator]

The component (B) is a photo-acid generator and is not particularly limited, as long as it breaks down by light radiation and generates acid. The photo-acid generator preferably generates acid by irradiation with light having a wavelength of 190 to 500 nm. The photo-acid generator (B) is used as a curing catalyst. Examples of the photo-acid generator include onium salts, diazomethane derivatives, glyoxime derivatives, β-ketosulfone derivatives, disulfone derivatives, nitrobenzylsulfonate derivatives, sulfonate ester derivatives, imid-yl-sulfonate derivatives, oximesulfonate derivatives, iminosulfonate derivatives, triazine derivatives, etc.

Examples of the onium salts include a sulfonium salt shown by the following formula (B1) or an iodonium salt shown by the following formula (B2).

(B1)
(B2)

In the formulae (B1) and (B2), $R^{101}$ to $R^{105}$ each independently represent an alkyl group having 1 to 12 carbon atoms optionally having a substituent, an aryl group having 6 to 12 carbon atoms optionally having a substituent, or an aralkyl group having 7 to 12 carbon atoms optionally having a substituent. $A^-$ represents a non-nucleophilic counter ion.

The alkyl group may be linear, branched, or cyclic. Examples thereof include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, a cyclopentyl group, a cyclohexyl group, a norbornyl group, an adamantyl group, etc. Examples of the aryl group include a phenyl group, a naphthyl group, a biphenylyl group, etc. Examples of the aralkyl group include a benzyl group, a phenethyl group, etc.

Examples of the substituents include an oxo group, linear, branched, or cyclic alkoxy groups having 1 to 12 carbon atoms, linear, branched, or cyclic alkyl groups having 1 to 12 carbon atoms, aryl groups having 6 to 24 carbon atoms, aralkyl groups having 7 to 25 carbon atoms, aryloxy groups having 6 to 24 carbon atoms, arylthio groups having 6 to 24 carbon atoms, etc.

Preferable examples of $R^{101}$ to $R^{105}$ include alkyl groups optionally having a substituent, such as a methyl group, an ethyl group, *a propyl group, a butyl group, a cyclohexyl group, a norbornyl group, an adamantyl group, and a 2-oxo-cyclohexyl group; aryl groups optionally having a substituent, such as a phenyl group, a naphthyl group, a biphenylyl group, o-, m- or p-methoxyphenyl group, ethoxyphenyl group, m- or p-tert-butoxyphenyl group, 2-, 3- or 4-methylphenyl group, ethylphenyl group, 4-tert-butylphenyl group, 4-butylphenyl group, dimethylphenyl group, terphenylyl group, biphenylyloxyphenyl group, and biphenylylthiophenyl group; and aralkyl groups optionally having a substituent, such as a benzyl group and a phenethyl group. Among these, aryl groups optionally having a substituent and aralkyl groups optionally having a substituent are more preferable.

Examples of the non-nucleophilic counter ion include halide ions, such as chloride ion and bromide ion; fluoroalkanesulfonate ions, such as triflate ion, 1,1,1-trifluoroethanesulfonate ion, and nonafluorobutanesulfonate ion; arylsulfonate ions, such as tosylate ion, benzenesulfonate ion, 4-fluorobenzenesulfonate ion, and 1,2,3,4,5-pentafluorobenzenesulfonate ion; alkanesulfonate ions, such as mesylate ion and butanesulfonate ion; fluoroalkanesulfone imide ions, such as trifluoromethanesulfone imide ion; fluoroalkanesulfonyl methide ions, such as tris(trifluoromethanesulfonyl)methide ion; borate ions, such as tetrakisphenylborate ion and tetrakis(pentafluorophenyl)borate ion; etc.

Examples of the diazomethane derivatives include a compound shown by the following formula (B3).

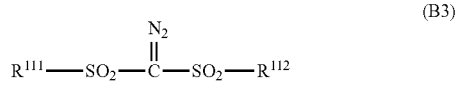

(B3)

In the formula (B3), $R^{111}$ and $R^{112}$ each independently represent an alkyl group or halogenated alkyl group having 1 to 12 carbon atoms, an aryl group having 6 to 12 carbon atoms, or an aralkyl group having 7 to 12 carbon atoms which optionally have a substituent.

The alkyl group may be linear, branched, or cyclic. Specific examples thereof include those exemplified in the description of $R^{101}$ to $R^{105}$. Examples of the halogenated alkyl group include a trifluoromethyl group, a 1,1,1-trifluoroethyl group, a 1,1,1-trichloroethyl group, a nonafluorobutyl group, etc.

Examples of the aryl group optionally having a substituent include a phenyl group; alkoxyphenyl groups, such as 2-, 3- or 4-methoxyphenyl group, 2-, 3- or 4-ethoxyphenyl group, and 3- or 4-tert-butoxyphenyl group; alkylphenyl groups, such as 2-, 3- or 4-methylphenyl group, ethylphenyl group, 4-tert-butylphenyl group, 4-butylphenyl group, and dimethylphenyl group; halogenated aryl groups, such as a fluorophenyl group, a chlorophenyl group, and a 1,2,3,4,5-pentafluorophenyl group; etc. Examples of the aralkyl group optionally having a substituent include a benzyl group, a phenethyl group, etc.

Examples of the glyoxime derivatives include a compound shown by the following formula (B4).

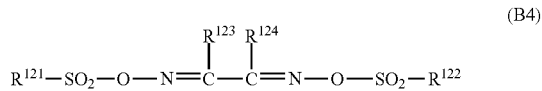

(B4)

In the formula (B4), $R^{121}$ to $R^{124}$ each independently represent an alkyl group or halogenated alkyl group having 1 to 12 carbon atoms, an aryl group having 6 to 12 carbon atoms, or an aralkyl group having 7 to 12 carbon atoms which optionally have a substituent. Alternatively, $R^{123}$ and $R^{124}$ may bond with each other to form a ring together with carbon atoms bonded with $R^{123}$ and $R^{124}$. When a ring is formed, $R^{123}$ and $R^{124}$ bonded with each other form a group which is a linear or branched alkylene group having 1 to 12 carbon atoms.

Examples of the alkyl group, halogenated alkyl group, aryl group and aralkyl group which optionally have a substituent include those exemplified as $R^{11}1$ and $R^{112}$. Examples of the linear or branched alkylene group include a methylene group, an ethylene group, a propylene group, a butylene group, a hexylene group, etc.

Specific examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, [4-(4-biphenylylthio)phenyl]-4-biphenylylphenylsulfonium tris(trifluoromethanesulfonyl)methide, triphenylsulfonium tetrakis(fluorophenyl)borate, tris [4-(4-acetylphenyl)thiophenyl]sulfonium tetrakis(fluorophenyl)borate, triphenylsulfonium tetrakis(pentafluorophenyl)borate, tris[4-(4-acetylphenyl)thiophenyl]sulfonium tetrakis(pentafluorophenyl)borate, etc.

Specific examples of the diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl) diazomethane, bis(n-pentylsulfonyl)diazomethane, bis(isopentylsulfonyl)diazomethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, 1-tert-pentylsulfonyl-1-(tert-butylsulfonyl)diazomethane, etc.

Specific examples of the glyoxime derivatives include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, bis-o-(camphorsulfonyl)-α-dimethylglyoxime, etc.

Specific examples of the β-ketosulfone derivatives include 2-cyclohexylcarbonyl-2-(p-toluenesulfonyl)propane, 2-isopropylcarbonyl-2-(p-toluenesulfonyl)propane, etc.

Specific examples of the disulfone derivatives include diphenyldisulfone, dicyclohexyldisulfone, etc.

Specific examples of the nitrobenzylsulfonate derivatives include 2,6-dinitrobenzyl p-toluenesulfonate, 2,4-dinitrobenzyl p-toluenesulfonate, etc.

Specific examples of the sulfonate ester derivatives include 1,2,3-tris(methanesulfonyloxy)benzene, 1,2,3-tris(trifluoromethanesulfonyloxy)benzene, 1,2,3-tris(p-toluenesulfonyloxy)benzene, etc.

Specific examples of the imid-yl-sulfonate derivatives include phthalimid-yl-triflate, phthalimid-yl-tosylate, 5-norbornene-2,3-dicarboxyimid-yl-triflate, 5-norbornene-2,3-dicarboxyimid-yl-tosylate, 5-norbornene-2,3-dicarboxyimid-yl-n-butylsulfonate, n-trifluoromethylsulfonyloxynaphthylimide, etc.

Specific examples of the oximesulfonate derivatives include α-(benzenesulfonium oxyimino)-4-methylphenylacetonitrile, etc.

Specific examples of the iminosulfonate derivatives include (5-(4-methylphenyl)sulfonyloxyimino-5H-thiophen-2-ylidene)-(2-methylphenyl)acetonitrile, (5-(4-(4-methylphenylsulfonyloxy)phenylsulfonyloxyimino)-5H-thiophen-2-ylidene)-(2-methylphenyl)-acetonitrile, etc.

Specific examples of the triazine derivatives include 2-(methoxyphenyl)-4,6-bis(trichloromethyl)-s-triazine, 2-[2-(3,4-dimethoxyphenyl)ethenyl]-4,6-bis(trichloromethyl)-s-triazine, 2-[2-(furan-2-yl)ethenyl]-4,6-bis(trichloromethyl)-s-triazine, 2-[2-(5-methylfuran-2-yl)ethenyl]-4,6-bis(trichloromethyl)-s-triazine, etc.

Additionally, 2-methyl-2-[(4-methylphenyl) sulfonyl]-1-[(4-methylthio)phenyl]-1-propane and the like are also suitably usable.

The photo-acid generator of the component (B) is particularly preferably the onium salts, more preferably the sulfonium salt.

The component (B) is contained in an amount of preferably 0.05 to 20 parts by mass, more preferably 0.2 to 5 parts by mass, relative to 100 parts by mass of the component (A). When the content of the component (B) is within the ranges, this further helps to achieve sufficient photo-curability. Note that, to achieve desired transparency and light resistance, the photo-acid generator of the component (B) having light absorbability is preferably blended in a small amount and in such a range as to avoid impairment of the photo-curability. One kind of the photo-acid generator of the component (B) may be used singly, or two or more kinds thereof may be used in combination.

[(C) Quantum Dots]

Quantum dot is a nano-sized semiconductor substance. Atoms form a molecule, and molecules constitute a small molecular aggregate called cluster and form nanoparticles. When such nanoparticles particularly exhibit semiconductor properties, these are called quantum dots (quantum dot particles).

When quantum dots are excited by receiving external energy, energy is released according to corresponding energy band gap by its nature (autonomously).

Red and green quantum dot particles can be categorized according to particle sizes, and the particle sizes decrease in the order of red and green. Specifically, red quantum dot particles have particle sizes of 5 to 10 nm, while green quantum dot particles have particle sizes of 3 to 5 nm. When irradiated with light, red quantum dot particles release red light, and green quantum dot particles release green light.

The quantum dot particles are not particularly limited, as long as the quantum dot particles can emit light by light stimulation. For example, the quantum dot particles can be selected from the group consisting of II-VI semiconductor compounds; III-V semiconductor compounds; IV-VI semiconductor compounds; group IV elements or compounds containing these elements; and combinations thereof. These can be used singly, or two or more thereof can be use in mixture.

The II-VI semiconductor compounds can be selected from the group consisting of binary compounds selected from the group consisting of CdS, CdSe, CdTe, ZnS, ZnSe, ZnTe, ZnO, HgS, HgSe, HgTe, and mixtures thereof; ternary compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, and mixtures thereof; and quaternary compounds selected from the group consisting of CdZnSeS, CdZnSeTe, CdZnSTe, CdHgSeS, CdHgSeTe, CdHgSTe, HgZnSeS, HgZnSeTe, HgZnSTe, and mixtures thereof.

The III-V semiconductor compounds can be selected from the group consisting of binary compounds selected from the group consisting of GaN, GaP, GaAs, GaSb, AlN, AlP, AlAs, AlSb, InN, InP, InAs, InSb, and mixtures thereof; ternary compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and quaternary compounds selected from the group consisting of GaAlNAs, GaAlNSb, GaAl- PAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The IV-VI semiconductor compounds can be selected from the group consisting of binary compounds selected from the group consisting of SnS, SnSe, SnTe, PbS, PbSe, PbTe, and mixtures thereof; ternary compounds selected from the group consisting of SnSeS, SnSeTe, SnSTe, PbSeS, PbSeTe, PbSTe, SnPbS, SnPbSe, SnPbTe, and mixtures thereof; and quaternary compounds selected from the group consisting of SnPbSSe, SnPbSeTe, SnPbSTe, and mixtures thereof.

The group IV elements or compounds containing these elements can be selected from the group consisting of element compounds selected from the group consisting of Si, Ge, and mixtures thereof; and binary compounds selected from the group consisting of SiC, SiGe, and mixtures thereof.

Moreover, the semiconductor crystal particles may be cores alone, or may have core-shell structure. The structure is not limited and can be appropriately selected. Further, the semiconductor crystal particles may be spherical, cubic, or rod shaped. The shape is not limited and can be selected freely.

The method of blending the quantum dots is not particularly limited. Desirably, after preparing a colloidal solution of quantum dots and a mixed solution of the other components, these are further mixed so as to blend the quantum dots. Mixing as described above can suppress aggregation of the quantum dots.

From the viewpoints of emission intensity and fine pattern formation, the proportion of the quantum dot particles in terms of solid content is preferably 3 to 80 mass %, more preferably 5 to 70 mass %, further preferably 10 to 60 mass %, based on a total solid content of the photosensitive resin composition. When the content percentage of the quantum dot particles is within these ranges, fine patterning is possible while favorable emission intensity is retained.

[(D) Crosslinking Agent]

The inventive photosensitive resin composition may further contain a crosslinking agent as a component (D). The crosslinking agent reacts with an epoxy group and the like of the component (A), and can facilitate pattern formation. In addition, this component further increases the strength of the resin film after photo-curing.

The crosslinking agent is preferably a compound having two or more epoxy groups, alicyclic epoxy groups, oxetane groups, or vinyl ether groups per molecule on average. For example, the following compounds are adoptable. The compound is preferably a low-molecular-weight compound or high-molecular weight compound with a Mw of 100 to 20,000, more preferably 200 to 10,000. With Mw of 100 or more, sufficient photo-curability can be achieved. The Mw of 20,000 or less is preferable because the heat resistance will not be degraded after the composition is photo-cured.

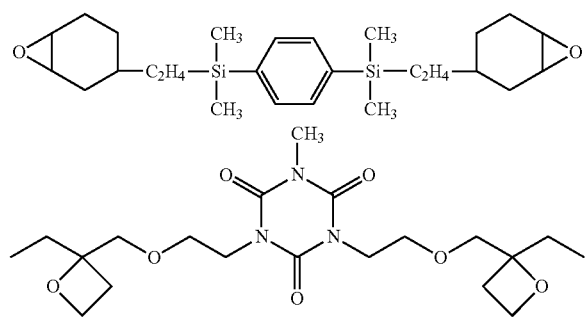

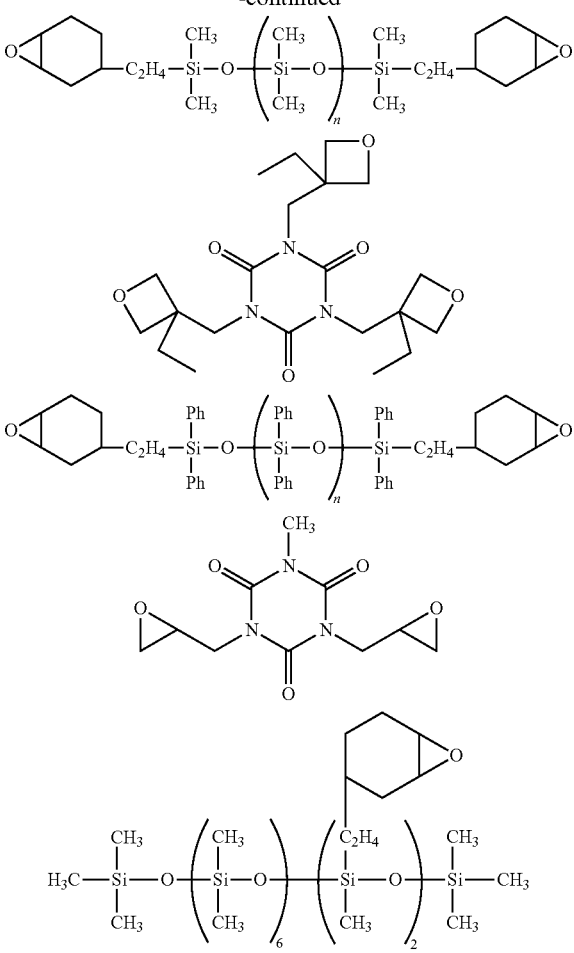

In the formulae, "n" represents 1 to 50.

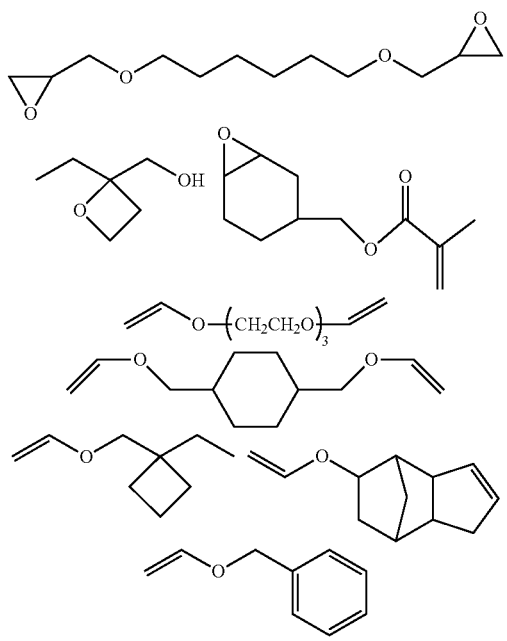

The component (D) can be contained in an amount of 0 to 100 parts by mass relative to 100 parts by mass of the component (A). When the component (D) is contained, the content is preferably 0.5 to 100 parts by mass, more preferably 1 to 50 parts by mass. When the content of the component (D) is 0.5 parts by mass or more, sufficient curability is achieved at the light irradiation. When the content is 100 parts by mass or less, the proportion of the component (A) in the photosensitive resin composition is not so low that the cured product can sufficiently exhibit the effects of the present invention. One kind of the component (D) can be used singly, or two or more kinds thereof can be used in combination.

[(E) Antioxidant]

The inventive photosensitive resin composition may contain an antioxidant as an additive. Incorporating an antioxidant can enhance the heat resistance. Examples of the antioxidant include hindered phenol compounds, hindered amine compounds, etc.

The hindered phenol compounds are not particularly limited, and the following are preferable. Examples thereof include 1,3,5-trimethyl-2,4,6-tris(3,5-di-tert-butyl-4-hydroxybenzyl)benzene (product name: IRGANOX 1330), 2,6-di-tert-butyl-4-methylphenol (product name: Sumilizer BHT), 2,5-di-tert-butyl-hydroquinone (product name: Nocrac NS-7), 2,6-di-tert-butyl-4-ethylphenol (product name: Nocrac M-17), 2,5-di-tert-pentylhydroquinone (product name: Nocrac DAH), 2,2'-methylenebis(4-methyl-6-tert-butylphenol) (product name: Nocrac NS-6), 3,5-di-tert-butyl-4-hydroxy-benzylphosphonate-diethyl ester (product name: IRGANOX 1222), 4,4'-thiobis(3-methyl-6-tert-butylphenol) (product name: Nocrac 300), 2,2'-methylenebis(4-ethyl-6-tert-butylphenol) (product name: Nocrac NS-5), 4,4'-butylidenebis(3-methyl-6-tert-butylphenol) (product name: adeka STAB AO-40), 2-tert-butyl-6-(3-tert-butyl-2-hydroxy-5-methylbenzyl)-4-methylphenyl acrylate (product name: Sumilizer GM), 2-[1-(2-hydroxy-3,5-di-tert-pentylphenyl) ethyl]-4,6-di-tert-pentylphenyl acrylate (product name: Sumilizer GS), 2,2'-methylenebis[4-methyl-6-(α-methyl-cyclohexyl)phenol], 4,4'-methylenebis(2,6-di-tert-butylphenol) (product name: SEENOX 226M), 4,6-bis (octylthiomethyl)-o-cresol (product name: IRGANOX 1520L), 2,2'-ethylenebis(4,6-di-tert-butylphenol), octadecyl-3-(3,5-di-tert-butyl-4-hydroxyphenyl)propionate (product name: IRGANOX 1076), 1,1,3-tris-(2-methyl-4-hydroxy-5-tert-butylphenyl)butane (product name: adeka STAB AO-30), tetrakis[methylene-(3,5-di-tert-butyl-4-hydroxyhydrocinnamate)]methane (product name: adeka STAB AO-60), triethylene glycol bis[3-(3-tert-butyl-5-methyl-4-hydroxyphenyl)propionate](product name: IRGANOX 245), 2,4-bis-(n-octylthio)-6-(4-hydroxy-3,5-di-tert-butylanilino)-1,3,5-triazine (product name: IRGANOX 565), N,N'-hexamethylenebis(3,5-di-tert-butyl-4-hydroxyhydroxycinnamide) (product name: IRGANOX 1098), 1,6-hexanediolbis[3-(3,5-di-tert-butyl-4-hydroxyphenyl)propionate] (product name: IRGANOX 259), 2,2-thiodiethylenebis[3-(3,5-di-tert-butyl-4-hydroxyphenyl) propionate] (product name: IRGANOX 1035), 3,9-bis[2-[3-(3-tert-butyl-4-hydroxy-5-methylphenyl)propionyloxy]1,1-dimethylethyl]2,4,8,10-tetraoxaspiro[5.5]undecane (product name: Sumilizer GA-80), tris-(3,5-di-tert-butyl-4-hydroxybenzyl)isocyanurate (product name: IRGANOX 3114), bis (3,5-di-tert-butyl-4-hydroxybenzyl phosphonic acid ethyl) calcium/polyethylene wax mixture (50:50) (product name: IRGANOX 1425WL), isooctyl-3-(3,5-di-tert-butyl-4-hydroxyphenyl)propionate (product name: IRGANOX 1135), 4,4'-thiobis(6-tert-butyl-3-methylphenol) (product name: Sumilizer WX-R), 6-[3-(3-tert-butyl-4-hydroxy-5-methylphenyl)propoxy]-2,4,8,10-tetra-tert-butyldibenz[d,f][1,3,2]dioxaphosphepin (product name: Sumilizer GP), etc.

The hindered amine compounds are not particularly limited, and the following are preferable. Examples thereof include p,p'-dioctyldiphenylamine (product name: IRGANOX 5057), phenyl-α-naphthylamine (product name: Nocrac PA), poly(2,2,4-trimethyl-1,2-dihydroquinoline) (product name: Nocrac 224, 224-S), 6-ethoxy-2,2,4-trimethyl-1,2-dihydroquinoline (product name: Nocrac AW), N,N'-diphenyl-p-phenylenediamine (product name: Nocrac DP), N,N'-di-@-naphthyl-p-phenylenediamine (product name: Nocrac White), N-phenyl-N'-isopropyl-p-phenylenediamine (product name: Nocrac 810NA), N,N'-diallyl-p-phenylenediamine (product name: Nonflex TP), 4,4'-(α,α-dimethylbenzyl)diphenylamine (product name: Nocrac CD), p,p-toluenesulfonylaminodiphenylamine (product name: Nocrac TD), N-phenyl-N'-(3-methacryloyloxy-2-hydroxypropyl)-p-phenylenediamine (product name: Nocrac G1), N-(1-methylheptyl)-N'-phenyl-p-phenylenediamine (product name: Ozonon 35), N,N'-di-sec-butyl-p-phenylenediamine (product name: Sumilizer BPA), N-phenyl-N'-1,3-dimethylbutyl-p-phenylenediamine (product name: Antigene 6C), alkylated diphenylamine (product name: Sumilizer 9A), dimethyl succinate-1-(2-hydroxyethyl)-4-hydroxy-2,2,6,6-tetramethyl piperidine polycondensate (product name: Tinuvin 622LD), poly[[6-(1,1,3,3-tetramethylbutyl)amino-1,3,5-triazine-2,4-diyl][(2,2,6,6-tetramethyl-4-piperidyl)imino]hexamethylene[(2,2,6,6-tetramethyl-4-piperidyl)imino]] (product name: CHIMASSORB 944), N,N'-bis(3-aminopropyl)ethylenediamine-2,4-bis[N-butyl-N-(1,2,2,6,6-pentamethyl-4-piperidyl)amino]-6-chloro-1,3,5-triazine condensate (product name: CHIMASSORB 119FL), bis(1-octyloxy-2,2,6,6-tetramethyl-4-piperidyl)sebacate (product name: TINUVIN 123), bis(2,2,6,6-tetramethyl-4-piperidyl)sebacate (product name: TINUVIN 770), 2-(3,5-di-tert-butyl-4-hydroxybenzyl)-2-n-butyl malonic acid bis (1,2,2,6,6-pentamethyl-4-piperidyl) (product name: TINUVIN 144), bis(1,2,2,6,6-pentamethyl-4-piperidyl)sebacate (product name: TINUVIN 765), tetrakis(1,2,2,6,6-pentamethyl-4-piperidyl)1,2,3,4-butanetetracarboxylate (product name: LA-57), tetrakis(2,2,6,6-tetramethyl-4-piperidyl)1,2,3,4-butanetetracarboxylate (product name: LA-52), an esterified mixture of 1,2,3,4-butanetetracarboxylic acid with 1,2,2,6,6-pentamethyl-4-piperidinol and 1-tridecanol (product name: LA-62), an esterified mixture of 1,2,3,4-butanetetracarboxylic acid with 2,2,6,6-tetramethyl-4-piperidinol and 1-tridecanol (product name: LA-67), an esterified mixture of 1,2,3,4-butanetetracarboxylic acid with 1,2,2,6,6-pentamethyl-4-piperidinol and 3,9-bis(2-hydroxy-1,1-dimethylethyl)-2,4,8,10-tetraoxaspiro[5.5]undecane (product name: LA-63P), an esterified mixture of 1,2,3,4-butanetetracarboxylic acid with 2,2,6,6-tetramethyl-4-piperidinol and 3,9-bis(2-hydroxy-1,1-dimethylethyl)-2,4,8,10-tetraoxaspiro[5.5]undecane (product name: LA-68LD), (2,2,6,6-tetramethylene-4-piperidyl)-2-propylenecarboxylate (product name: adeka STAB LA-82), (1,2,2,6,6-pentamethyl-4-piperidyl)-2-propylenecarboxylate (product name: adeka STAB LA-87), etc.

The content of the component (E) is not particularly limited. When the component (E) is contained, the content in the inventive photosensitive resin composition is preferably 0.01 to 1 mass %. One kind of the antioxidant of the component (E) may be used singly, or two or more kinds thereof may be used in combination.

[(F) Solvent]

The inventive photosensitive resin composition may contain a solvent as a component (F) to enhance the coatability. The solvent (F) is not particularly limited, as long as it can dissolve and disperse the above-described components (A) to (E) and other various additives therein.

The solvent (F) is preferably an organic solvent. Specific examples thereof include ketones, such as cyclohexanone, cyclopentanone, and methyl-2-n-pentyl ketone; alcohols, such as 3-methoxybutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, and γ-butyrolactone; etc. One of these may be used singly, or two or more thereof may be used in mixture.

The solvent (F) is particularly preferably ethyl lactate, cyclohexanone, cyclopentanone, propylene glycol monomethyl ether acetate, γ-butyrolactone, and mixture solvents thereof because of excellent solubility for the photo-acid generator.

The component (F) is contained in an amount of preferably 200 to 20,000 parts by mass, more preferably 250 to 10,000 parts by mass, further preferably 350 to 3,500 parts by mass, relative to 100 parts by mass of a total of the components (A) and (C) from the viewpoints of compatibility and viscosity of the photosensitive resin composition.

[Other Additives]

The inventive photosensitive resin composition may contain other additives, besides the above-described components. Examples of the additives include a surfactant commonly used to enhance coatability.

The surfactant is preferably nonionic. Examples thereof include fluorine-based surfactants, specifically, perfluoroalkyl polyoxyethylene ethanols, fluorinated alkyl esters, perfluoroalkylamine oxides, fluorine-containing organosiloxane-based compounds, etc. When used, these may be commercially available products. Examples thereof include Fluorad(registered trademark) "FC-430" (manufactured by 3M), Surflon(registered trademark) "S-141" and "S-145" (manufactured by AGC SEIMI CHEMICAL CO., LTD.), UNIDYNE(registered trademark) "DS-401", "DS-4031", and "DS-451" (manufactured by DAIKIN INDUSTRIES, LTD.), Megafac(registered trademark) "F-8151" (manufactured by DIC Corporation), "X-70-093" (manufactured by Shin-Etsu Chemical Co., Ltd.), etc. Among these, Fluorad FC-430 and X-70-093 are preferable. The content of the surfactant is not particularly limited. When the surfactant is contained, the content in the inventive photosensitive resin composition is preferably 0.01 to 1 mass %.

Moreover, a silane coupling agent can also be used as an additive. Incorporating a silane coupling agent can further enhance the adhesiveness of the photosensitive resin composition to an adherend. Examples of the silane coupling agent include epoxy silane coupling agents, aromatic group-containing amino silane coupling agents, etc. One of these can be used singly, or two or more thereof can be used in combination. The content of the silane coupling agent is not particularly limited. When the silane coupling agent is contained, the content in the inventive photosensitive resin composition is preferably 0.01 to 5 mass %.

[Patterning Process Using Photosensitive Resin Composition]

A patterning process using the inventive photosensitive resin composition includes steps of:
(i) applying the photosensitive resin composition onto a substrate to form a photosensitive resin film on the substrate;
(ii) exposing the photosensitive resin film to light; and
(iii) developing the exposed photosensitive resin film with a developer.

The step (i) is a step in which the photosensitive resin composition is applied onto a substrate to form a photosensitive resin film on the substrate. The photosensitive resin film is a dried product of the above-described photosensitive resin composition. Examples of the substrate include silicon wafers, glass wafers, quartz wafers, plastic circuit substrates, ceramic circuit substrates, etc.

The application method can be a known method. Examples thereof include a dipping method, a spin coating method, a roll coating method, etc. The application amount can be appropriately selected in accordance with the purpose. The application is preferably performed to obtain the photosensitive resin film (dried product of the photosensitive resin composition) with a thickness of preferably 1 to 5,000 nm, more preferably 50 to 4,000 nm.

To enhance the film thickness uniformity on a substrate surface, a solvent may be dropped on the substrate before the photosensitive resin composition is applied (pre-wetting method). The solvent to be dropped can be appropriately selected in accordance with the purpose. Preferable examples of the solvent include alcohols, such as isopropyl alcohol (IPA); ketones, such as cyclohexanone; glycols, such as propylene glycol monomethyl ether; etc. It is also possible to use the solvent used for the photosensitive resin composition.

In this case, the solvent or the like may be preliminary evaporated by pre-heating (pre-baking) as necessary for efficient photo-curing reaction. The pre-baking can be performed, for example, at 40 to 140° C. for about 1 minute to 1 hour.

Then, (ii) the photo-curable resin layer is exposed to light. In this event, the exposure is preferably performed with light having a wavelength of 10 to 600 nm, more preferably performed with light having a wavelength of 190 to 500 nm. The light having such wavelengths are, for example, light having various wavelengths generated from a radiation-beam generating instrument. Examples of the light include ultraviolet light, such as a g-line, an h-line, and an i-line; far ultraviolet light (248 nm, 193 nm); etc. Among these, light with a wavelength of 248 to 436 nm is particularly preferable. The exposure dose is preferably 10 to 10,000 mJ/cm$^2$.

The exposure may be performed via a photomask. The photomask may have a desired pattern by boring, for example. Note that the material of the photomask is not particularly limited, but is preferably one that blocks light with the aforementioned wavelength. For example, a photomask including a light-blocking film made of chromium is suitably used, but is not limited thereto.

Then, in order to enhance the development sensitivity, the post-exposure baking (PEB) may be carried out. The PEB is preferably performed at 40 to 150° C. for 0.5 to 10 minutes. PEB makes the exposed part crosslinked to form an insoluble pattern that is insoluble in an organic solvent, which is a developer.

(iii) The exposed photosensitive resin film is developed with a developer after the exposure or PEB, so that an unexposed portion is dissolved and removed to form a pattern. The developer is preferably an organic solvent. Examples thereof include alcohols, such as IPA; ketones, such as cyclohexanone; glycols, such as propylene glycol monomethyl ether, etc. It is also possible to use the solvent used for the photosensitive resin composition. Examples of the development method include usual methods, for example, a method in which the patterned substrate is soaked into the developer; etc. By the development with such organic solvent, the unexposed portion is dissolved and removed, so that a pattern is formed. Then, if necessary, washing, rinsing, drying, and so forth are carried out to give a film having a desired pattern.

Further, (iv) the patterned film may be post-cured by using an oven, hot plate, or the like, at preferably 100 to 250° C., more preferably 150 to 220° C. A resin film excellent in various film properties can be obtained by using the inventive photosensitive resin composition even when the post-curing is performed at relatively low temperature around 200° C. Note that the post-curing temperature of 100 to 250° C. increases the crosslinking density of the photosensitive resin composition and can remove the remaining volatile component; thus, such temperatures are preferable from the viewpoints of adhesive force to the substrate, heat resistance, strength, electrical properties, and bond strength. The post-curing time is preferably 10 minutes to 10 hours, more preferably 10 minutes to 3 hours. After the post-curing, the resin film has a thickness of normally 1 to 200 µm, preferably 5 to 50 µm. Through these steps, a film for light emitting device can be obtained, which is the final target.

[Photosensitive Dry Film]

A photosensitive dry film according to the present invention includes: a support film; and a photosensitive resin film on the support film, the photosensitive resin film being obtained from the photosensitive resin composition.

The photosensitive dry film (a support film and a photosensitive resin film) is solid, and the photosensitive resin film does not contain a solvent. Accordingly, bubbles due to the volatilization of the solvent will not remain in the photosensitive resin film and between this film and an uneven substrate. The thickness of the photosensitive resin film is not particularly limited, but is preferably 1 to 200 µm, more preferably 3 to 100 µm.

In addition, the viscosity and fluidity of the photosensitive resin film are closely related. The photosensitive resin film can exhibit appropriate fluidity in an appropriate viscosity range; the photosensitive resin film deeply enters into a narrow gap and the resin softens, so that the adhesion to a substrate can be enhanced. Thus, the photosensitive resin film has a viscosity of preferably 10 to 5,000 Pa·s, more preferably 30 to 2,000 Pa·s, further preferably 50 to 300 Pa·s, at 80 to 120° C. from the viewpoint of the fluidity of the photosensitive resin film. Note that, in the present invention, the viscosity is a value measured with a rotational viscometer.

When the inventive photosensitive dry film is brought into close contact with an uneven substrate, the photosensitive resin film fits in and covers the unevenness, so that high flatness can be achieved. Particularly, the inventive photosensitive resin composition is characterized by softening performance, so that higher planarization can be achieved. Further, bringing the photosensitive resin film into close contact with the substrate under vacuum environment makes it possible to more effectively prevent a gap therebetween.

The inventive photosensitive dry film can be produced by applying the photosensitive resin composition onto a base material, and drying the composition to form a photosensitive resin film. As the production apparatus for the photosensitive dry film, it is possible to employ a film coater which is commonly used to produce adhesive products. Examples of the film coater include a comma coater, a comma reverse coater, a multi coater, a die coater, a lip coater, a lip reverse coater, a direct gravure coater, an offset gravure coater, a 3-roll bottom reverse coater, a 4-roll bottom reverse coater, etc.

When the support film is rolled-out from a roll-out shaft of the film coater and passes through a coater head of the film coater, the photosensitive resin composition is applied to have a predetermined thickness onto the support film; then, the resultant is passed through a hot-air circulating oven at a predetermined temperature for a predetermined period to dry and form the photosensitive resin film on the support film, so that the photosensitive dry film can be produced. It is also possible to produce the photosensitive dry film having a protective film in accordance with need by: passing the photosensitive dry film through a laminate roll under a predetermined pressure together with the protective film that has been rolled-out from another roll-out shaft of the film coater, thereby bonding the protective film to the photosensitive resin film on the support film; and subsequently winding up the resulting laminate to a winding shaft of the film coater. In this case, the temperature is preferably 25 to 150° C., the period is preferably 1 to 100 minutes, and the pressure is preferably of 0.01 to 5 MPa.

The support film used in the inventive photosensitive dry film may be a monolayer film composed of a single film or a multilayer film composed of multiple laminated films. Examples of the material of the film include synthetic resin films, such as polyethylene, polypropylene, polycarbonate, and polyethylene terephthalate. Among these, preferable is polyethylene terephthalate having appropriate flexibility, mechanical strength, and heat resistance. These films may have been subjected to various treatments, such as corona treatment and coating treatment with a releasing agent. Commercial products may be used for these. Examples thereof include Cerapeel WZ (RX) and Cerapeel BX8 (R) (both are manufactured by Toray Advanced Film Co., Ltd.), E7302 and E7304 (both are manufactured by Toyobo Co., Ltd.), Purex G31 and Purex G71T1 (both are manufactured by Teijin DuPont Films Japan Ltd.), PET38×1-A3, PET38×1-V8, and PET38×1-X08 (all manufactured by Nippa Co., Ltd.), etc.

The protective film to be used may be the same film as the above-mentioned support film, but polyethylene terephthalate and polyethylene having appropriate flexibility are preferred. Commercial products may be used for these. Examples thereof include the polyethylene terephthalates that have already been exemplified; polyethylenes, such as GF-8 (manufactured by Tamapoly Co., Ltd.) and PE Film 0-Type (manufactured by Nippa Co., Ltd.); etc.

The thicknesses of both the support film and the protective film are preferably 10 to 100 µm, more preferably 25 to 50 µm, from the viewpoints of stable production of the photosensitive dry film and the rolling habit around a roll shaft, what is called curl-prevention.

[Patterning Process Using Photosensitive Dry Film]

A patterning process using the inventive photosensitive dry film includes steps of:

(i') forming the photosensitive resin film on a substrate by using the photosensitive dry film;

(ii) exposing the photosensitive resin film to light; and (iii) developing the exposed photosensitive resin film with a developer to dissolve and remove an unexposed portion for patterning.

First, (i') the photosensitive dry film is used to form the photosensitive resin film on a substrate. Specifically, the photosensitive resin film of the photosensitive dry film is bonded to a substrate, so that the photosensitive resin film is formed on the substrate. Meanwhile, in the case where the photosensitive dry film has a protective film, after the protective film is peeled from the photosensitive dry film, the photosensitive resin film of the photosensitive dry film is bonded to the substrate. The bonding can be performed, for example, by using a film-adhering apparatus.

The film-adhering apparatus is preferably a vacuum laminator. For example, the protective film of the photosensitive dry film is delaminated, and the uncovered photosensitive resin film is brought into close contact with the substrate on a table at a predetermined temperature by using an adhering roll under a predetermined pressure in a vacuum chamber with a predetermined degree of vacuum. It is to be noted that the temperature is preferably 60 to 120° C., the pressure is preferably 0 to 5.0 MPa, and the degree of vacuum is preferably 50 to 500 Pa.

For efficient photo-curing reaction of the photosensitive resin film and for adhesiveness enhancement between the photosensitive resin film and the substrate, pre-baking may be performed as necessary. The pre-baking can be performed, for example, at 40 to 140° C. for about 1 minute to 1 hour.

The photosensitive resin film adhered on the substrate can be subjected to (ii) the step of exposing the photosensitive resin film to light, (iii) the step of developing the exposed photosensitive resin film with a developer to dissolve and remove an unexposed portion for patterning, and as necessary (iv) the heating treatment for post-curing to form a pattern as in the case of the patterning process using the photosensitive resin composition. Note that the support film of the photosensitive dry film is delaminated or removed by other methods before the pre-bake or before the PEB, depending on the process.

The patterning processes using the inventive photosensitive resin composition or photosensitive dry film make it possible to easily form fine patterns with large thickness. For example, using the inventive photosensitive dry film to cover numerous blue micro-LEDs laid over a substrate, embedding is performed, followed by pattern formation such that the photosensitive insulating film including the quantum dots of red, green, etc. is formed at corresponding sections on the blue micro-LEDs. These enable light emission of red, green, etc.

EXAMPLE

Hereinafter, the present invention will be more specifically described with reference to Synthesis Examples, Examples, and Comparative Examples. However, the present invention is not limited to the following Examples. Incidentally, each Mw was measured by GPC in terms of monodispersed polystyrene as a standard by using a column of TSKgel Super HZM-H (product of Tosoh Corporation) under analysis conditions of a flow rate: 0.6 ml/min, an eluting solvent: tetrahydrofuran, and a column temperature: 40° C.

Compounds (S-1) to (S-5) used in the following Examples and Comparative Examples were as below.

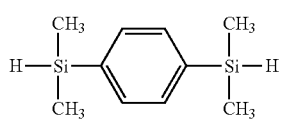
(S-1)

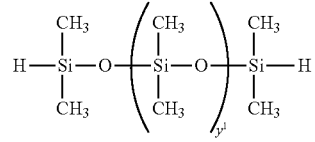
(S-2)

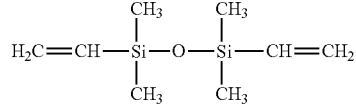
(S-3)

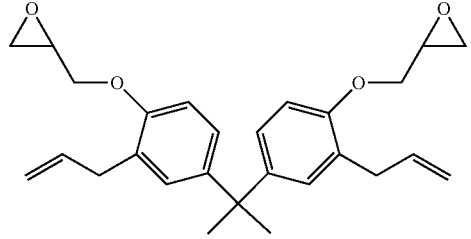
(S-4)

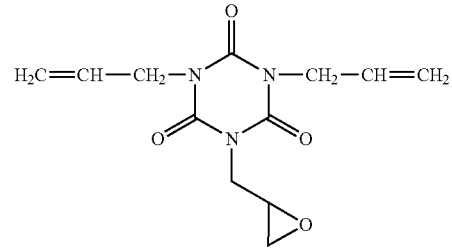
(S-5)

[1] Synthesis of Acid-Crosslinkable Group-Containing Silicone Resins

[Synthesis Example 1] Synthesis of Resin A-1

Into a 3-L flask equipped with a stirrer, a thermometer, a nitrogen inflow instrument, and a reflux condenser, 265.0 g (1.00 mol) of Compound (S-5) was introduced. Then, 2,000 g of toluene was added thereto, and the mixture was heated to 70° C. Subsequently, 1.0 g of toluene solution of chloroplatinic acid (platinum concentration: 0.5 mass %) was introduced, and 164.9 g (0.85 mol) of Compound (S-1) and 453.0 g (0.15 mol) of Compound (S-2) ($y^1$=40, manufactured by Shin-Etsu Chemical Co., Ltd.) were added dropwise over 1 hour (total of hydrosilyl groups/total of alkenyl groups=1/1 (molar ratio)). After completion of the dropwise addition, the mixture was heated to 100° C. and aged for 6 hours. Thereafter, toluene was evaporated from the reaction solution under reduced pressure. Thus, Resin A-1 was obtained. The structure of Resin A-1 was identified by 1H-NMR, $^{29}$Si-NMR (with Bruker Corporation product), and GPC measurement. Resin A-1 had a Mw of 65,000 and a silicone content percentage of 51.3 mass %. Moreover, in the formulae (A1) to (A6), a=b=c=d=0, e=0.85, f=0.15, z=1, and m=41.

Note that the silicone content percentage was determined by $^{29}$Si-NMR (with Bruker Corporation product).

[Synthesis Example 2] Synthesis of Resin A-2

Into a 3-L flask equipped with a stirrer, a thermometer, a nitrogen inflow instrument, and a reflux condenser, 111.6 g (0.60 mol) of Compound (S-3) and 156.8 g (0.40 mol) of Compound (S-4) were introduced. Then, 2,000 g of toluene was added thereto, and the mixture was heated to 70° C. Subsequently, 1.0 g of toluene solution of chloroplatinic acid (platinum concentration: 0.5 mass %) was introduced, and 135.8 g (0.70 mol) of Compound (S-1) and 906.0 g (0.30 mol) of Compound (S-2) ($y^1=40$, manufactured by Shin-Etsu Chemical Co., Ltd.) were added dropwise over 1 hour (total of hydrosilyl groups/total of alkenyl groups=1/1 (molar ratio)). After completion of the dropwise addition, the mixture was heated to 100° C. and aged for 6 hours. Thereafter, toluene was evaporated from the reaction solution under reduced pressure. Thus, Resin A-2 was obtained. The structure of Resin A-2 was identified by 1H-NMR, $^{29}$Si-NMR (with Bruker Corporation product), and GPC measurement. Resin A-2 had a Mw of 55,000 and a silicone content percentage of 77.7 mass %. Moreover, in the formulae (A1) to (A6), $a=0.42$, $b=0.18$, $c=0.28$, $d=0.12$, $e=f=0$, $p=1$, $x=0$, $y=1$, $g=h=0$, and $m=41$.

[Synthesis Example 3] Synthesis of Resin A-3

Into a 3-L flask equipped with a stirrer, a thermometer, a nitrogen inflow instrument, and a reflux condenser, 111.6 g (0.60 mol) of Compound (S-3) and 106.0 g (0.40 mol) of Compound (S-5) were introduced. Then, 2,000 g of toluene was added thereto, and the mixture was heated to 70° C. Subsequently, 1.0 g of toluene solution of chloroplatinic acid (platinum concentration: 0.5 mass %) was introduced, and 174.6 g (0.90 mol) of Compound (S-1) and 302.0 g (0.10 mol) of Compound (S-2) ($y^1=40$, manufactured by Shin-Etsu Chemical Co., Ltd.) were added dropwise over 1 hour (total of hydrosilyl groups/total of alkenyl groups=1/1 (molar ratio)). After completion of the dropwise addition, the mixture was heated to 100° C. and aged for 6 hours. Thereafter, toluene was evaporated from the reaction solution under reduced pressure. Thus, Resin A-3 was obtained. The structure of Resin A-3 was identified by 1H-NMR, $^{29}$Si-NMR (with Bruker Corporation product), and GPC measurement. Resin A-3 had a Mw of 50,000 and a silicone content percentage of 59.6 mass %. Moreover, in the formulae (A1) to (A6), $a=0.54$, $b=0.06$, $c=d=0$, $e=0.36$, $f=0.04$, $p=1$, $x=0$, $z=1$, and $m=41$.

[Synthesis Example 4] Synthesis of Resin A-4

Into a 3-L flask equipped with a stirrer, a thermometer, a nitrogen inflow instrument, and a reflux condenser, 392.0 g (1.00 mol) of Compound (S-4) was introduced. Then, 2,000 g of toluene was added thereto, and the mixture was heated to 70° C. Subsequently, 1.0 g of toluene solution of chloroplatinic acid (platinum concentration: 0.5 mass %) was introduced, and 155.2 g (0.80 mol) of Compound (S-1) and 317.0 g (0.20 mol) of Compound (S-2) ($y^1=20$, manufactured by Shin-Etsu Chemical Co., Ltd.) were added dropwise over 1 hour (total of hydrosilyl groups/total of alkenyl groups=1/1 (molar ratio)). After completion of the dropwise addition, the mixture was heated to 100° C. and aged for 6 hours. Thereafter, toluene was evaporated from the reaction solution under reduced pressure. Thus, Resin A-4 was obtained. The structure of Resin A-4 was identified by $^1$H-NMR, $^{29}$Si-NMR (with Bruker Corporation product), and GPC measurement. Resin A-4 had a Mw of 23,000 and a silicone content percentage of 36.7 mass %. Moreover, in the formulae (A1) to (A6), $a=b=0$, $c=0.8$, $d=0.2$, $e=f=0$, $y=1$, $g=h=0$, and $m=21$.

[Synthesis Example 5] Synthesis of Resin A-5

Into a 3-L flask equipped with a stirrer, a thermometer, a nitrogen inflow instrument, and a reflux condenser, 274.4 g (0.70 mol) of Compound (S-4) and 79.5 g (0.30 mol) of Compound (S-5) were introduced. Then, 2,000 g of toluene was added thereto, and the mixture was heated to 70° C. Subsequently, 1.0 g of toluene solution of chloroplatinic acid (platinum concentration: 0.5 mass %) was introduced, and 58.2 g (0.30 mol) of Compound (S-1) and 1,109.5 g (0.70 mol) of Compound (S-2) ($y^1=20$, manufactured by Shin-Etsu Chemical Co., Ltd.) were added dropwise over 1 hour (total of hydrosilyl groups/total of alkenyl groups=1/1 (molar ratio)). After completion of the dropwise addition, the mixture was heated to 100° C. and aged for 6 hours. Thereafter, toluene was evaporated from the reaction solution under reduced pressure. Thus, Resin A-5 was obtained. The structure of Resin A-5 was identified by 1H-NMR, $^{29}$Si-NMR (with Bruker Corporation product), and GPC measurement. Resin A-5 had a Mw of 42,000 and a silicone content percentage of 72.9 mass %. Moreover, in the formulae (A1) to (A6), $a=b=0$, $c=0.21$, $d=0.49$, $e=0.09$, $f=0.21$, $y=1$, $g=h=0$, $z=1$, and $m=21$.

[Synthesis Example 6] Synthesis of Resin A-6

Into a 3-L flask equipped with a stirrer, a thermometer, a nitrogen inflow instrument, and a reflux condenser, 55.8 g (0.30 mol) of Compound (S-3), 117.6 g (0.30 mol) of Compound (S-4), and 106.0 g (0.40 mol) of Compound (S-5) were introduced. Then, 2,000 g of toluene was added thereto, and the mixture was heated to 70° C. Subsequently, 1.0 g of toluene solution of chloroplatinic acid (platinum concentration: 0.5 mass %) was introduced, and 135.8 g (0.70 mol) of Compound (S-1) and 475.5 g (0.30 mol) of Compound (S-2) ($y^1=20$, manufactured by Shin-Etsu Chemical Co., Ltd.) were added dropwise over 1 hour (total of hydrosilyl groups/total of alkenyl groups=1/1 (molar ratio)). After completion of the dropwise addition, the mixture was heated to 100° C. and aged for 6 hours. Thereafter, toluene was evaporated from the reaction solution under reduced pressure. Thus, Resin A-6 was obtained. The structure of Resin A-6 was identified by $^1$H-NMR, $^{29}$Si-NMR (with Bruker Corporation product), and GPC measurement. Resin A-6 had a Mw of 31,000 and a silicone content percentage of 59.6 mass %. Moreover, in the formulae (A1) to (A6), $a=0.21$, $b=0.09$, $c=0.21$, $d=0.09$, $e=0.28$, $f=0.12$, $p=1$, $x=0$, $y=1$, $g=h=0$, $z=1$, and $m=21$.

[Comparative Synthesis Example 1] Synthesis of Acrylic Resin 1

Into a flask equipped with a stirrer, a reflux condenser, an inert gas inlet, and a thermometer, 70 g of propylene glycol monomethyl ether and 70 g of toluene were introduced. The temperature was raised to 80° C. under nitrogen gas atmosphere. While the reaction temperature was kept at 80° C.±2° C., 90 g of methyl methacrylate, 10 g of methacrylic acid, and 2,2'-azobis(isobutyronitrile) were uniformly added dropwise over 4 hours. After the dropwise addition, stirring was continuously performed at 80° C.±2° C. for 6 hours. Thus, a solution of Acrylic resin 1 (Resin 7) was obtained. Acrylic resin 1 had a Mw of 50,000.

[2] Preparation and Evaluation of Photosensitive Resin Compositions

Examples 1 to 12 and Comparative Examples 1 to 17

In accordance with the formulation amounts shown in Tables 1 to 3, the components were blended. Then, each blend was stirred, mixed, and dissolved at normal temperature. Thus, photosensitive resin compositions of Examples 1 to 12 and Comparative Examples 1 to 17 were obtained.

TABLE 1

| | Components | | Example 1 | 2 | 3 | 4 | 5 | 6 | 7 | 8 | 9 | 10 | 11 | 12 | Comparative Example 1 |
|---|---|---|---|---|---|---|---|---|---|---|---|---|---|---|---|
| A | Silicone resin | Resin A-1 | 100 | | | | | | 100 | | | | | | 100 |
| | | Resin A-2 | | 100 | | | | | | 100 | | | | | |
| | | Resin A-3 | | | 100 | | | | | | 100 | | | | |
| | | Resin A-4 | | | | 100 | | | | | | 100 | | | |
| | | Resin A-5 | | | | | 100 | | | | | | 100 | | |
| | | Resin A-6 | | | | | | 100 | | | | | | 100 | |
| B | Photo-acid generator | PAG-1 | 1 | 1 | 1 | 1 | 5 | 1 | 1 | 1 | 1 | 1 | 5 | 1 | 1 |
| C | Quantum dots | Red-1 | 100 | | 450 | | 100 | | | | | | | | |
| | | Red-2 | | 100 | | 7 | | 100 | | | | | | | |
| | | Green-1 | | | | | | | 100 | | 450 | | 100 | | |
| | | Green-2 | | | | | | | | 100 | | 7 | | 100 | |
| D | Crosslinking agent | D-1 | 30 | | | 30 | | | 30 | | | 30 | | | 30 |
| | | D-2 | | 30 | | | | | | 30 | | | | | |
| | | D-3 | | | 30 | | | 60 | | | 30 | | | 60 | |
| E | Antioxidant | E-1 | 0.1 | 0.1 | 0.1 | 0.1 | 0.1 | | 0.1 | 0.1 | 0.1 | 0.1 | 0.1 | | 0.1 |
| | | E-2 | 0.1 | 0.1 | 0.1 | 0.1 | 0.1 | | 0.1 | 0.1 | 0.1 | 0.1 | 0.1 | | 0.1 |
| F | Solvent | cyclopentanone | 231 | 231 | 581 | 138 | 205 | 261 | 231 | 231 | 581 | 138 | 205 | 261 | 131.2 |
| Quantum-dot content percentage in total solid content/% | | | 43 | 43 | 77 | 5 | 49 | 38 | 43 | 43 | 77 | 5 | 49 | 38 | 0 |

TABLE 2

| | Components | Comparative Example 2 | 3 | 4 | 5 | 6 | 7 | 8 | 9 |
|---|---|---|---|---|---|---|---|---|---|
| Acrylic resin | Resin 7 | 50 | 50 | 100 | | 50 | 50 | 100 | |
| | Resin 8 | 50 | 50 | | 100 | 50 | 50 | | 100 |
| Photopolymerization initiator | Irgacure OXE02 | 1 | 1 | 1 | 1 | 1 | 1 | 1 | 1 |
| Quantum dots | Red-1 | 80 | | 300 | | | | | |
| | Red-2 | | 80 | | 5 | | | | |
| | Green-1 | | | | | 80 | | 300 | |
| | Green-2 | | | | | | 80 | | 5 |
| Antioxidant | E-1 | 0.1 | 0.1 | 0.1 | 0.1 | 0.1 | 0.1 | 0.1 | 0.1 |
| | E-2 | 0.1 | 0.1 | 0.1 | 0.1 | 0.1 | 0.1 | 0.1 | 0.1 |
| Solvent | methyl ethyl ketone | 181 | 181 | 401 | 106 | 181 | 181 | 401 | 106 |
| Quantum-dot content percentage in total solid content/% | | 44 | 44 | 75 | 5 | 44 | 44 | 75 | 5 |

Resin 7: Acrylic resin 1
Resin 8: Acrylic resin 2

TABLE 3

| | Components | Comparative Example 10 | 11 | 12 | 13 | 14 | 15 | 16 | 17 |
|---|---|---|---|---|---|---|---|---|---|
| Silane compound | tetraethoxysilane | 90 | 90 | 50 | 50 | 90 | 90 | 50 | 50 |
| | (3,3,3-trifluoropropyl)triethoxysilane | 10 | 10 | 50 | 50 | 10 | 10 | 50 | 50 |
| Polymerization catalyst | 0.02M hydrochloric acid | 1 | 1 | 1 | 1 | 1 | 1 | 1 | 1 |
| quantum dots | Red-1 | 80 | | 300 | | | | | |
| | Red-2 | | 80 | | 5 | | | | |
| | Green-1 | | | | | 80 | | 300 | |
| | Green-2 | | | | | | 80 | | 5 |
| Antioxidant | E-1 | 0.1 | 0.1 | 0.1 | 0.1 | 0.1 | 0.1 | 0.1 | 0.1 |
| | E-2 | 0.1 | 0.1 | 0.1 | 0.1 | 0.1 | 0.1 | 0.1 | 0.1 |
| Solvent | isopropanol | 181 | 181 | 401 | 106 | 181 | 181 | 401 | 106 |
| Quantum-dot content percentage in total solid content/% | | 44 | 44 | 75 | 5 | 44 | 44 | 75 | 5 |

The quantum dots in Tables 1 to 3:

Red-1 was S-BE030 manufactured by SHOEI CHEMICAL INC. (particle size: 5 to 10 nm, material: InP:ZnS:SeZn=25:50:25 colloid/PGMEA), Red-2 was 900514-1ML manufactured by Sigma-Aldrich Co. LLC (particle size: 5 to 10 nm, material: CdSe(core)/CdS(shell) core-shell type colloid/hexane), Green-1 was S-BE029 manufactured by SHOEI CHEMICAL INC. (particle size: 3 to 5 nm, material: InP:ZnS:SeZn=25:50:25 colloid/PGMEA), and Green-2 was 900511-1ML manufactured by Sigma-Aldrich Co. LLC (particle size: 3 to 5 nm, material: CdSe(core)/CdS(shell) core-shell type colloid/hexane).

Additionally, tetraethoxysilane and (3,3,3-trifluoropropyl)triethoxysilane were manufactured by Shin-Etsu Chemical Co., Ltd.

Moreover, Photo-acid generator PAG-1, Crosslinking agents D-1 to D-3, Antioxidants E-1 and E-2, Acrylic resin 2 (Resin 8), and photopolymerization initiator Irgacure OXE02 were as follows.

Photo-acid generator PAG-1: CPI-210S (manufactured by San-Apro Ltd.)

Crosslinking agent D-1: (manufactured by Shin-Etsu Chemical Co., Ltd.)

D-1

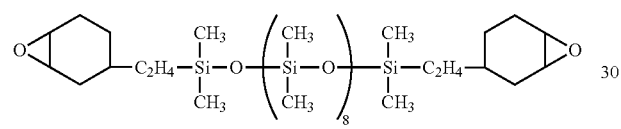

Crosslinking agent D-2: (manufactured by SHIKOKU CHEMICALS CORPORATION)

D-2

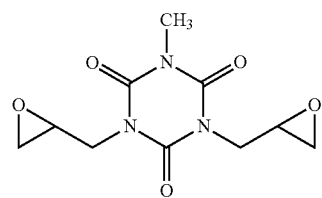

Crosslinking agent D-3: (manufactured by SHIKOKU CHEMICALS CORPORATION)

D-3

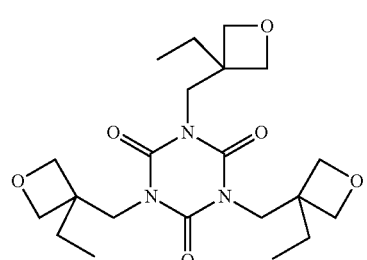

Antioxidant E-1: CHIMASSORB 119FL (manufactured by BASF SE)

E-1

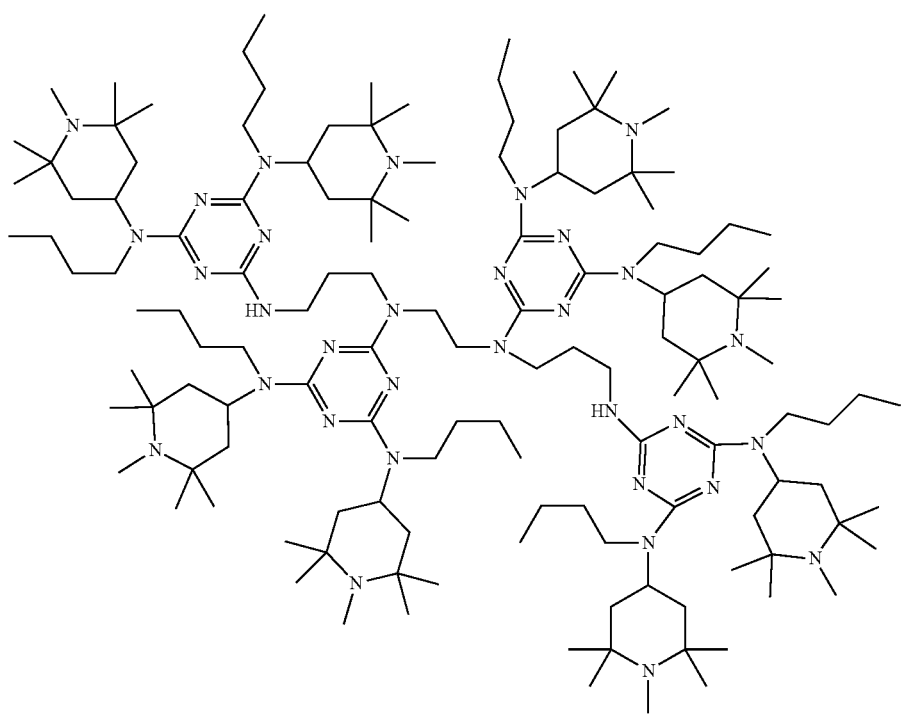

Antioxidant E-2: IRGANOX 3114 (manufactured by BASF SE)

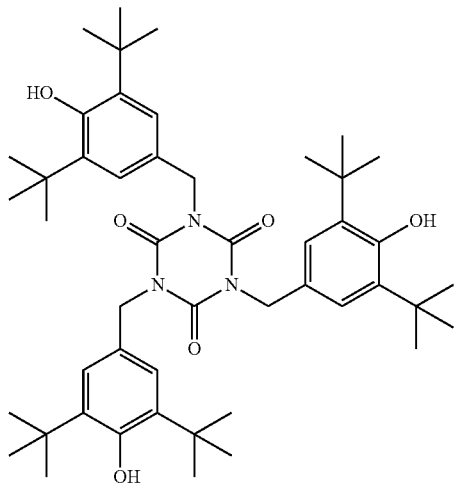

Acrylic resin 2 (Resin 8): product name "DPCA-20" manufactured by Nippon Kayaku Co., Ltd (acrylate of ε-caprolactone-modified dipentaerythrytol, see the following formula)

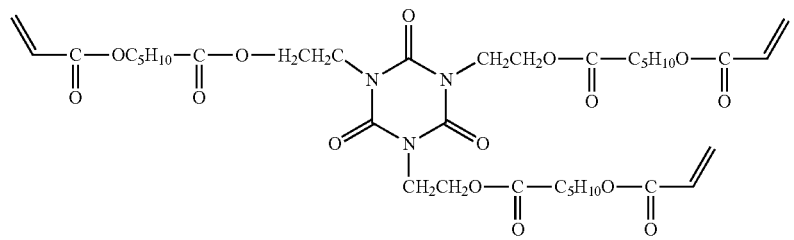

Photopolymerization initiator Irgacure OXE02: (ethanone, 1-[9-ethyl-6-(2-methylbenzoyl)-9H-carbazol-3-yl]-,1-(O-acetyloxime)) manufactured by BASF SE (1) Preparation of Photosensitive Dry Films and Evaluation of Dry Film Formability Using a die coater as a film coater, the photosensitive resin compositions shown in Tables 1 to 3 were respectively applied onto support films which were polyethylene terephthalate films (thickness: 38 μm). Then, the resultant was dried by passing, for 5 minutes, through a hot-air circulating oven (length: 4 m) set at 100° C. Thereby, a photosensitive resin film was formed on the support film, and a photosensitive dry film was obtained. Onto the photosensitive resin film, a polyethylene film (thickness: 100 μm) as a protective film was bonded using a laminate roll at a pressure of 1 MPa. In this manner, photosensitive dry films with protective films were prepared, each photosensitive dry film having a thickness of 50 μm. Subsequently, the protective films were peeled. "Good" in Tables 4 to 6 indicates the photosensitive dry film from which the protective film was successfully peeled without error mode such as unintentional separation, while "bad" indicates the peeling with error mode.

(2) Pattern Formation and Evaluation Thereof

Glass substrates were respectively coated with the photosensitive resin compositions by using a spin coater such that the resulting films had a thickness of 20 μm. To remove the solvent from each composition, the substrate was placed on a hot plate and dried by heating at 110° C. for 3 minutes. To form a 20 mm×20 mm pattern and contact hole patterns in the obtained photosensitive resin film through a mask, exposure was performed under exposure conditions of 365 nm by using a contact aligner type exposure apparatus. After the light irradiation, PEB was performed with a hot plate at 120° C. for 3 minutes, followed by cooling. The substrate was subjected to spray development with PGMEA (propylene glycol monomethyl ether acetate) for 60 seconds to form a pattern. The threshold resolution of the formed pattern was evaluated as follows.

(3) Heat Resistance Evaluation of Patterns

The photosensitive resin film on the substrate patterned by the above method was post-cured using an oven at 150° C. for 2 hours, while the oven was being purged with nitrogen. Subsequently, a scanning electron microscope (SEM) was used to observe the cross sections of the contact hole patterns of 50 μm, 30 μm, 20 μm, and 10 μm thus formed. The minimum hole pattern size with the hole penetrating to the film bottom was determined as a threshold resolution (Resolution threshold F). Note that the sample having no resolving power (threshold resolution) of even 50 μm was rated as "bad". Tables 4 to 6 show the result. Moreover, the 20 mm×20 mm pattern portion was left in the air at 150° C. for 100 hours (heat resistance evaluation). Thereafter, if peeling defect was formed, the sample was rated as "peel", if crack was formed, the sample was rated as "crack", and if any of these were not formed, the sample was rated as favorable ("good"), which are shown in Tables 4 to 6 below.

(4) Emission Intensity Measurement and Heat Resistance Evaluation

The 20 mm×20 mm pattern portion formed in (2) was irradiated with light by using 365 nm Tube-type 4-W UV irradiation instrument (VL-4LC, VILBER LOURMAT). The wavelength released by photoluminescence is 640 nm if containing the red quantum dots Red-1, Red-2; and 545 nm if containing the green quantum dots Green-1, Green-2. The emission intensity in the wavelength range released by photoluminescence was measured with a spectrometer (Ocean Optics Inc.). The values shown in Tables 4 to 6 below are such that the values of the samples containing the red quantum dots indicate the emission intensity ratios relative to the emission intensity of Example 1, which was set to 1.0 as the standard; meanwhile, the values of the samples containing the green quantum dots indicate the emission intensity ratios relative to the emission intensity of Example 7, which was set to 1.0 as the standard. Further, the pattern portion was left in the air at 150° C. for 100 hours (heat resistance evaluation), and the values of the emission intensity ratios thereafter were calculated in a similar manner and also shown in Tables 4 to 6 below.

TABLE 4

| | Example | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Dry film formability | good | good | good | good | good | good | good | good | good | good | good | good |
| Resolution threshold F (μm) | 20 | 20 | 20 | 20 | 20 | 20 | 20 | 20 | 20 | 20 | 20 | 20 |
| Pattern heat resistance evaluation | good | good | good | good | good | good | good | good | good | good | good | good |
| Emission intensity   initial | 1.0 | 1.0 | 1.7 | 0.2 | 1.2 | 0.9 | 1.0 | 1.0 | 1.7 | 0.2 | 1.2 | 0.9 |
| Emission intensity   after heat resistance evaluation | 0.9 | 0.9 | 1.5 | 0.2 | 1.1 | 0.7 | 0.9 | 0.9 | 1.5 | 0.2 | 1.1 | 0.7 |

TABLE 5

| | Comparative Example | | | | | | | | |
|---|---|---|---|---|---|---|---|---|---|
| | 1 | 2 | 3 | 4 | 5 | 6 | 7 | 8 | 9 |
| Dry film formability | bad | bad | bad | bad | bad | bad | bad | bad | bad |
| Resolution threshold F (μm) | 50 | 50 | 50 | 50 | 50 | 50 | 50 | 50 | 50 |
| Pattern heat resistance evaluation | good | peel | peel | peel | peel | peel | peel | peel | peel |
| Emission intensity   initial | 0.0 | 0.9 | 0.9 | 1.6 | 0.2 | 0.9 | 0.9 | 1.6 | 0.2 |
| Emission intensity   after heat resistance evaluation | 0.0 | 0.3 | 0.3 | 0.7 | 0.1 | 0.3 | 0.3 | 0.7 | 0.1 |

TABLE 6

| | Comparative Example | | | | | | | |
|---|---|---|---|---|---|---|---|---|
| | 10 | 11 | 12 | 13 | 14 | 15 | 16 | 17 |
| Dry film formability | bad | bad | bad | bad | bad | bad | bad | bad |
| Resolution threshold F (μm) | bad | bad | bad | bad | bad | bad | bad | bad |
| Pattern heat resistance evaluation | crack | crack | crack | crack | crack | crack | crack | crack |
| Emission intensity   initial | 0.9 | 0.9 | 1.6 | 0.2 | 0.9 | 0.9 | 1.6 | 0.2 |
| Emission intensity   after heat resistance evaluation | 0.7 | 0.7 | 1.4 | 0.2 | 0.7 | 0.7 | 1.4 | 0.2 |

The above results revealed that the inventive photosensitive resin compositions can provide cured films which have favorable dry film formability, resolution, luminous properties, and heat resistance (adhesiveness, crack resistance, emission intensity retention), and which are suitable in light emitting device.

In contrast, in Comparative Example 1 not containing quantum dots, no light was emitted. In Comparative Examples 2 to 9 using the acrylic resins in place of the component (A) in the present invention, all of the film formability, resolution, luminous properties, and heat resistance were inferior to the present invention. In Comparative Examples 10 to 17 using the silicone resin, the dry film formability and resolution were inferior, and crack formations were observed in the heat resistance evaluation.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:
1. A photosensitive resin composition comprising:
(A) an acid-crosslinkable group-containing silicone resin;
(B) a photo-acid generator; and
(C) quantum dot particles, wherein,
the component (A) comprises a silicone resin containing a repeating unit represented by any of the following formulae (A1) to (A6),

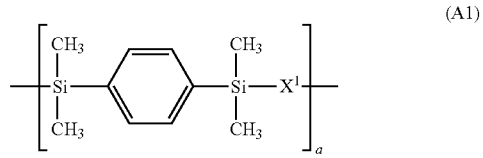

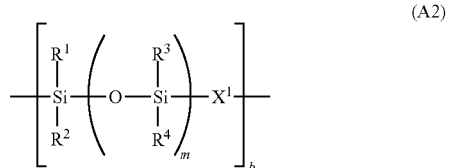

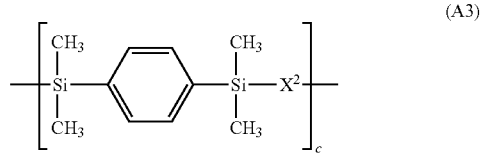

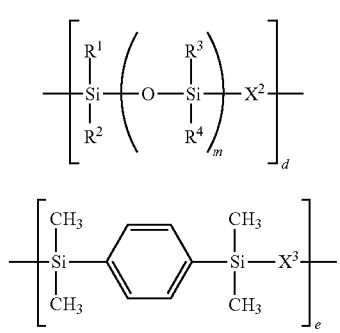

(A4)

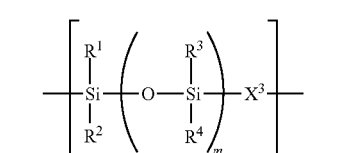

(A5)

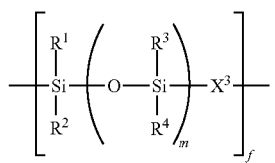

(A6)

wherein $R^1$ to $R^4$ each independently represent a monovalent hydrocarbon group having 1 to 20 carbon atoms optionally containing a heteroatom; each "m" independently represents an integer of 1 to 600, and when "m" is an integer of 2 or more, $R^3$'s are identical to or different from one another, and R4's are identical to or different from one another; "a", "b", "c", "d", "e", and "f" represent numbers satisfying $0 \leq a \leq 1$, $0 \leq b \leq 1$, $0 \leq c \leq 1$, $0 \leq d \leq 1$, $0 \leq e \leq 1$, $0 \leq f \leq 1$, $0 < c+d+e+f \leq 1$, and $a+b+c+d+e+f=1$; each $X^1$ represents a divalent group shown by the following formula (X1); each $X^2$ represents a divalent group shown by the following formula (X2); and each $X^3$ represents a divalent group shown by the following formula (X3),

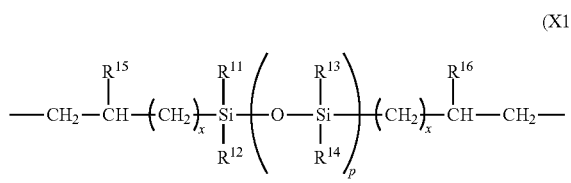

(X1)

wherein $R^{11}$ to $R^{14}$ each independently represent a monovalent hydrocarbon group having 1 to 20 carbon atoms optionally containing a heteroatom; "p" represents an integer of 1 to 600, and when "p" is an integer of 2 or more, $R^{13}$'s are identical to or different from one another, and $R^{14}$'s are identical to or different from one another; $R^{15}$ and $R^{16}$ each independently represent a hydrogen atom or a methyl group; and each "x" independently represents an integer of 0 to 7,

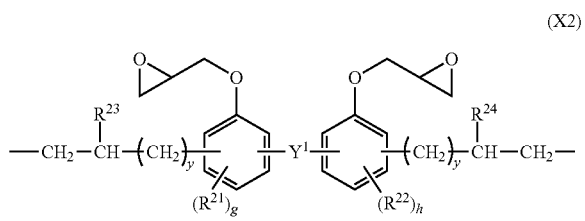

(X2)

wherein $Y^1$ represents a single bond, a methylene group, a propane-2,2-diyl group, a 1,1,1,3,3,3-hexafluoropropane-2,2-diyl group, or a fluorene-9,9-diyl group; $R^{21}$ and $R^{22}$ each independently represent an alkyl or alkoxy group having 1 to 4 carbon atoms; "g" and "h" each independently represent 0, 1, or 2, when "g" is 2, $R^{21}$'s are identical to or different from one another, and when "h" is 2, $R^{22}$'s are identical to or different from one another; $R^{23}$ and $R^{24}$ each independently represent a hydrogen atom or a methyl group; and each "y" independently represents an integer of 0 to 7, and

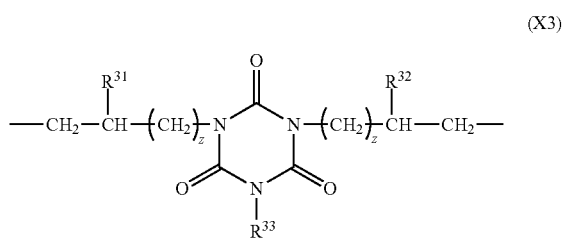

(X3)

wherein $R^{31}$ and $R^{32}$ each independently represent a hydrogen atom or a methyl group; each "z" independently represents an integer of 0 to 7; and $R^{33}$ represents a monovalent hydrocarbon group having 1 to 8 carbon atoms optionally containing an ester bond or an ether bond, or a monovalent group shown by the following formula (X3-1),

(X3-1)

wherein $R^{34}$ represents a divalent hydrocarbon group having 1 to 8 carbon atoms optionally containing an ester bond or an ether bond.

2. The photosensitive resin composition according to claim 1, wherein the quantum dot particles (C) comprise red quantum dot particles or green quantum dot particles.

3. The photosensitive resin composition according to claim 1, wherein the quantum dot particles (C) are composed of a II-VI semiconductor compound; a III-V semiconductor compound; a IV-VI semiconductor compound; a group IV element or a compound containing a group IV element; or a combination thereof.

4. The photosensitive resin composition according to claim 2, wherein the quantum dot particles (C) are composed of a II-VI semiconductor compound; a III-V semiconductor compound; a IV-VI semiconductor compound; a group IV element or a compound containing a group IV element; or a combination thereof.

5. The photosensitive resin composition according to claim 1, wherein the quantum dot particles (C) is contained in an amount of 3 to 80 mass % based on a total solid content of the photosensitive resin composition.

6. The photosensitive resin composition according to claim 2, wherein the quantum dot particles (C) is contained in an amount of 3 to 80 mass % based on a total solid content of the photosensitive resin composition.

7. The photosensitive resin composition according to claim 3, wherein the quantum dot particles (C) is contained in an amount of 3 to 80 mass % based on a total solid content of the photosensitive resin composition.

8. The photosensitive resin composition according to claim 1, further comprising (D) a crosslinking agent.

9. The photosensitive resin composition according to claim 1, further comprising (E) an antioxidant.

10. The photosensitive resin composition according to claim 1, further comprising (F) a solvent.

11. A photosensitive resin film comprising a dried product of the photosensitive resin composition according to claim 1.

12. A photosensitive dry film comprising:
a support film; and
the photosensitive resin film according to claim 11 on the support film.

13. A patterning process comprising steps of:
(i) applying the photosensitive resin composition according to claim 1 onto a substrate to form a photosensitive resin film on the substrate;
(ii) exposing the photosensitive resin film to light; and
(iii) developing the exposed photosensitive resin film with a developer to dissolve and remove an unexposed portion for patterning.

14. A patterning process comprising steps of:
(i') forming a photosensitive resin film on a substrate by using the photosensitive dry film according to claim 12;
(ii) exposing the photosensitive resin film to light; and
(iii) developing the exposed photosensitive resin film with a developer to dissolve and remove an unexposed portion for patterning.

15. The patterning process according to claim 13, further comprising (iv) a step of post-curing the resin film patterned by the development, the post-curing being performed at a temperature of 100 to 250° C.

16. The patterning process according to claim 14, further comprising (iv) a step of post-curing the resin film patterned by the development, the post-curing being performed at a temperature of 100 to 250° C.

17. A light emitting device comprising the photosensitive resin film according to claim 11.

18. The photosensitive resin composition according to claim 1, wherein "a", "c", and "e" in the formulae (A1), (A3) and (A5) represent numbers satisfying $0.2 \leq a+c+e \leq 0.95$.

19. The photosensitive resin composition according to claim 1, wherein "a", "b", "c", "d", "e", and "f" in the formulae (A1) to (A6) represent numbers satisfying $0.2 \leq a+c+e \leq 0.95$, $0.05 \leq b+d+f \leq 0.8$, $0 \leq a+b \leq 0.9$, $0 \leq c+d \leq 0.7$, and $0 < e+f \leq 1$.

* * * * *